(12) United States Patent
Catalasan et al.

(10) Patent No.: US 7,078,936 B2
(45) Date of Patent: Jul. 18, 2006

(54) COUPLING OF SIGNALS BETWEEN ADJACENT FUNCTIONAL BLOCKS IN AN INTEGRATED CIRCUIT CHIP

(75) Inventors: Manolito M. Catalasan, Mission Viejo, CA (US); Vafa J. Rakshani, Newport Coast, CA (US); Edmund H. Spittles, Chippenham (GB); Tim Sippel, Portland, OR (US); Richard Unda, Fullerton, CA (US)

(73) Assignee: Broadcom Corporation, Irvine, CA (US)

( * ) Notice: Subject to any disclaimer, the term of this patent is extended or adjusted under 35 U.S.C. 154(b) by 16 days.

(21) Appl. No.: 10/697,289

(22) Filed: Oct. 31, 2003

(65) Prior Publication Data

US 2004/0251501 A1    Dec. 16, 2004

Related U.S. Application Data

(60) Provisional application No. 60/488,800, filed on Jul. 22, 2003, provisional application No. 60/477,338, filed on Jun. 11, 2003.

(51) Int. Cl.
*H03K 19/00* (2006.01)
(52) U.S. Cl. ............... 326/102; 326/38; 257/211
(58) Field of Classification Search ........... 326/38–41, 326/101, 102, 10; 257/208, 211
See application file for complete search history.

(56) References Cited

U.S. PATENT DOCUMENTS 5,068,603 A * 11/1991 Mahoney .......... 714/726
5,408,428 A    4/1995 Bradley et al.
5,459,355 A   10/1995 Kreifels (Continued)

FOREIGN PATENT DOCUMENTS

EP    1 100 125    5/2001

(Continued)

OTHER PUBLICATIONS

Catalasan et al., U.S. Appl. No. 10/697,079, filed Oct. 31, 2003, entitled "Memory Cell For Modification Of Revision Identifier In An Integrated Circuit Chip," 54 pages.

(Continued)

*Primary Examiner*—Don Le
(74) *Attorney, Agent, or Firm*—Sterne, Kessler, Goldstein & Fox P.L.L.C.

(57) ABSTRACT

A modifiable circuit for coupling at least two adjacent logic blocks in an integrated circuit chip is disclosed. The chip includes a plurality of metal layers and first and second power supply potentials. The circuit comprises a first and second metal interconnect structures, and an interconnect. The first metal interconnect structure traverses the plurality of metal layers using a first plurality of vias, wherein the first metal interconnect structure is located at a boundary of the at least two adjacent logic blocks. The second metal interconnect structure traverses the plurality of metal layers using a second plurality of vias, wherein the second metal interconnect structure is located at the boundary of the at least two adjacent logic blocks. The interconnect is formed between the at least two adjacent logic blocks by at least one of the first and second metal interconnect structures, wherein a state of the interconnect is programmable by altering any one of the plurality of metal layers or any one of a plurality of via layers.

28 Claims, 42 Drawing Sheets

U.S. PATENT DOCUMENTS

| | | | |
|---|---|---|---|
| 5,590,069 | A | 12/1996 | Levin |
| 5,644,144 | A | 7/1997 | Ray |
| 5,831,280 | A * | 11/1998 | Ray .............................. 257/48 |
| 6,292,024 | B1 | 9/2001 | Jensen et al. |
| 6,331,790 | B1 * | 12/2001 | Or-Bach et al. ............... 326/41 |
| 6,765,245 | B1 * | 7/2004 | Bansal ........................ 257/202 |
| 6,933,547 | B1 | 8/2005 | Catalasan et al. |
| 2004/0251470 | A1 | 12/2004 | Catalasan et al. |
| 2004/0251472 | A1 | 12/2004 | Catalasan et al. |
| 2004/0253778 | A1 | 12/2004 | Catalasan et al. |

FOREIGN PATENT DOCUMENTS

| | | |
|---|---|---|
| EP | 1 494 283 A1 | 1/2005 |
| GB | 2 338 593 | 12/1999 |
| WO | WO 02/18960 A2 | 3/2002 |

OTHER PUBLICATIONS

Catalasan et al., U.S. Appl. No. 10/697,889, filed Oct. 31, 2003, entitled "Method For Manufacturing A Memory Cell For Modification Of Revision Identifier In An Integrated Circuit Chip," 53 pages.

Catalasan et al., U.S. Appl. No. 10/697,286, filed Oct. 31, 2003, entitled "Memory Cell For Modification Of Default Register Values In An Integrated Circuit Chip," 59 pages.

European Search Report, mailed Sep. 14, 2005, from European Patent Appln. No. 04016857.7, 3 pages.

Copy of European Search Report for European Appln. 04013796.0-2203 mailed Oct. 26, 2004.

Copy of European Search Report for European Appln. 04013796.0-2203 mailed Nov. 16, 2004.

* cited by examiner

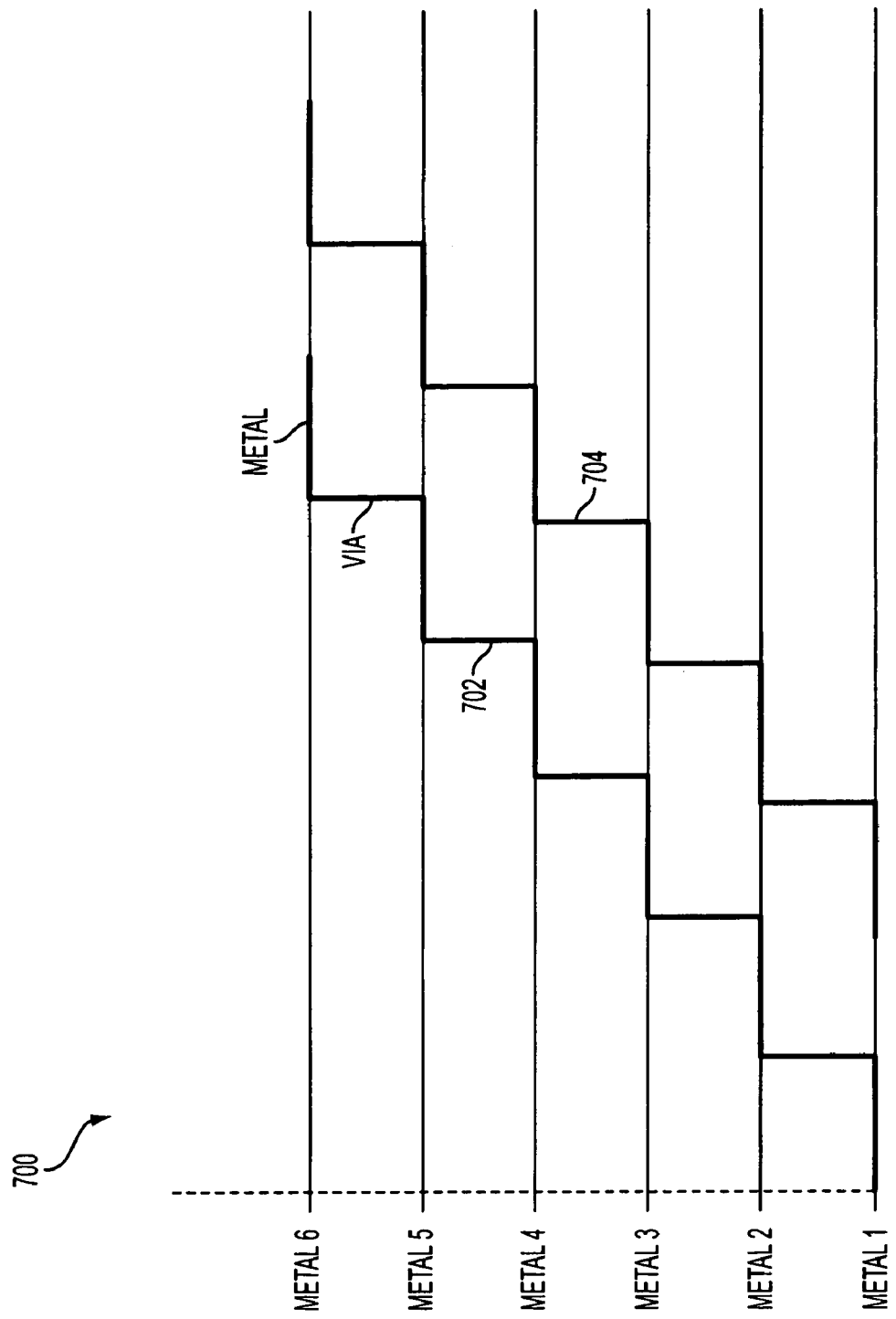

2 DISCONNECTS
2 CONNECTS

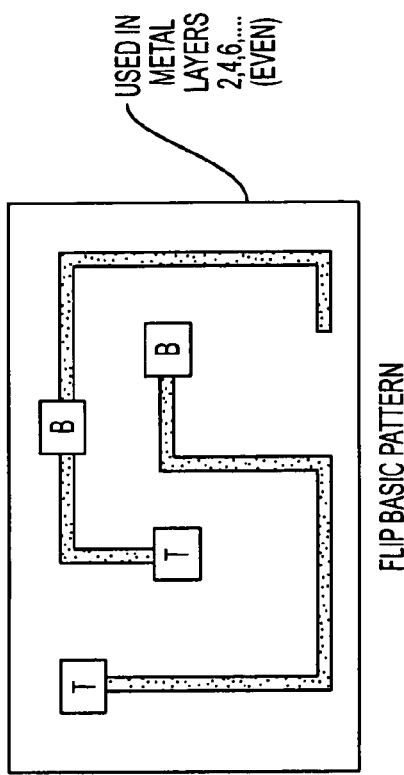
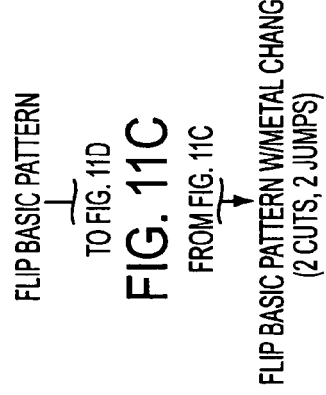
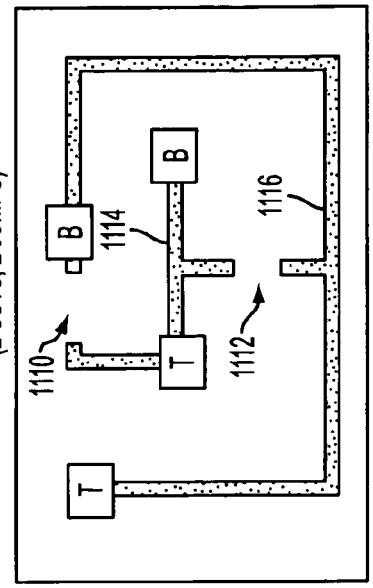
FIG. 11C
FIG. 11D
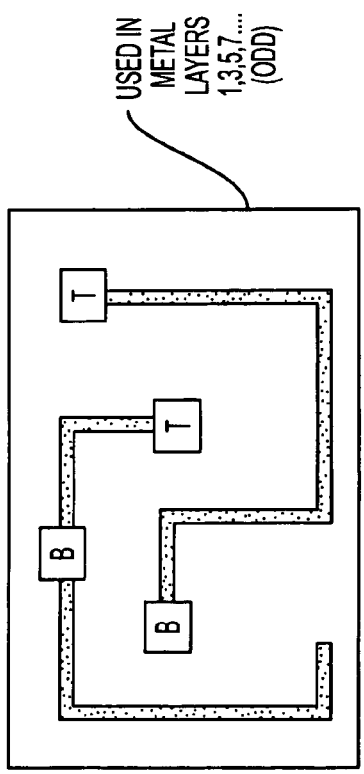
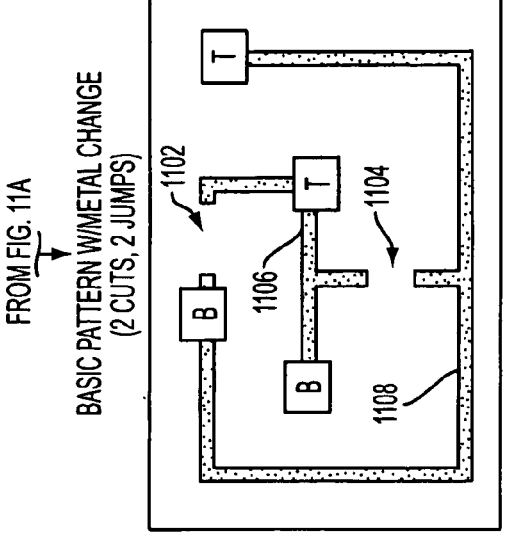
FIG. 11A
FIG. 11B

BASIC PATTERN
TO FIG. 12B

FLIP BASIC PATTERN
TO FIG. 12D

FROM FIG. 12A
BASIC PATTERN W/VIA CHANGE
(2 DISCONNECTS, 2 CONNECTS)

FROM FIG. 12C
FLIP BASIC PATTERN W/VIA CHANGE
(2 DISCONNECTS, 2 CONNECTS)

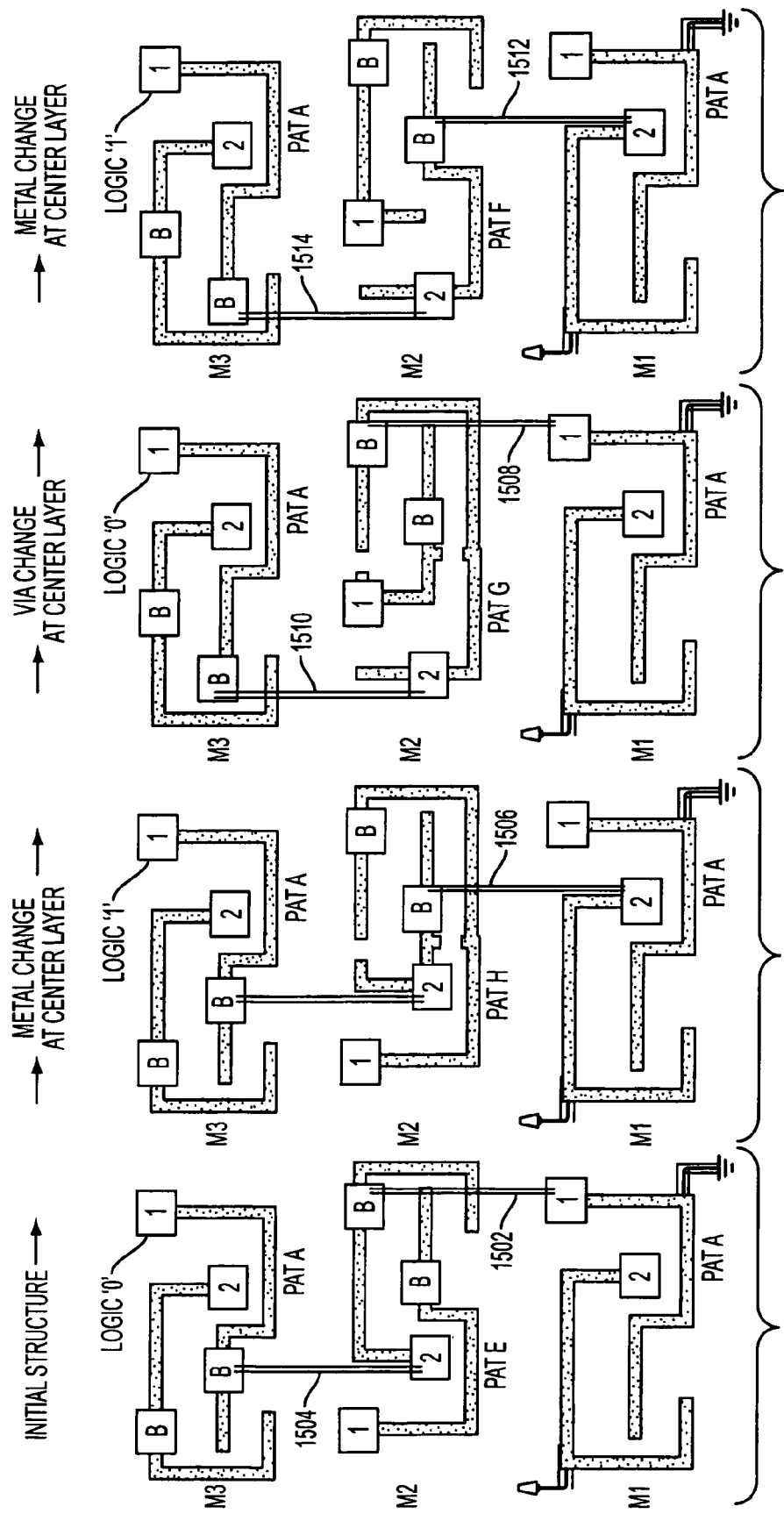

METAL 2

METAL 1, VIA1

METAL 1, VIA 1, METAL 2

| OUT | COMMENT |
|---|---|
| IN | DEFAULT<br>CONNECT AT ANY LAYER |
| 0 | TIED TO GND AT ANY LAYER |
| 1 | TIED TO VDD AT ANY LAYER |

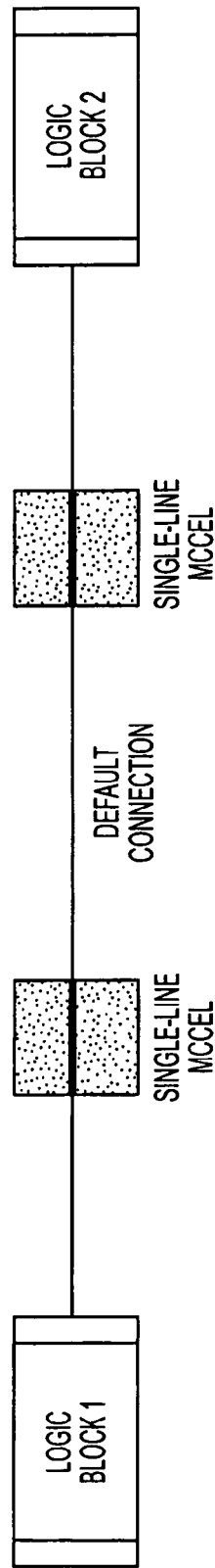
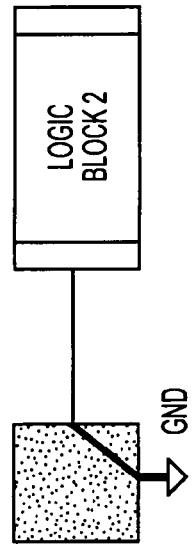
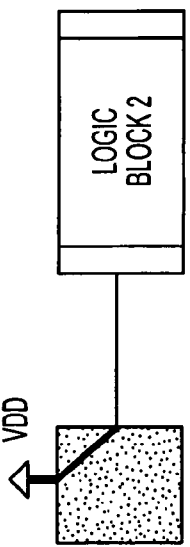
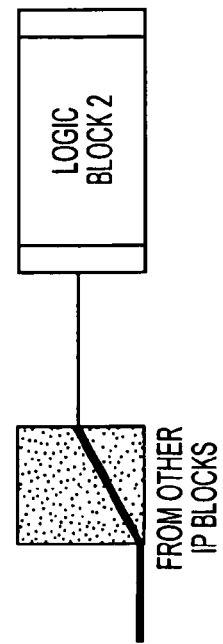
FIG. 26A
FIG. 26B
FIG. 26C
FIG. 26D

| TOGGLE | OUT_1 | OUT_2 | COMMENT |
|---|---|---|---|
| 0 | IN_1 | IN_2 | DEFAULT |
| 1 | IN_2 | IN_1 | METAL/VIA CHANGE |

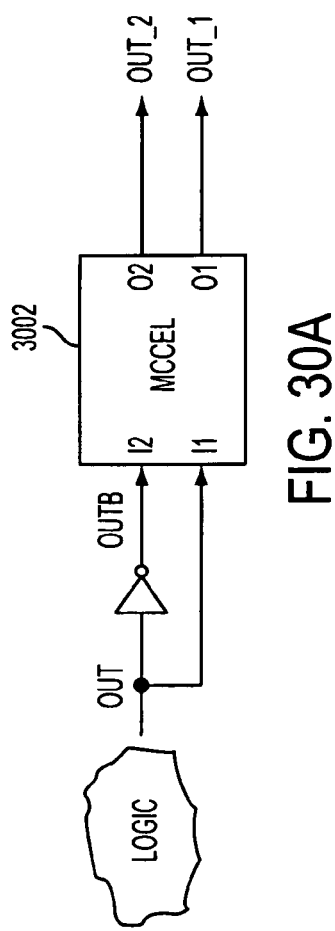
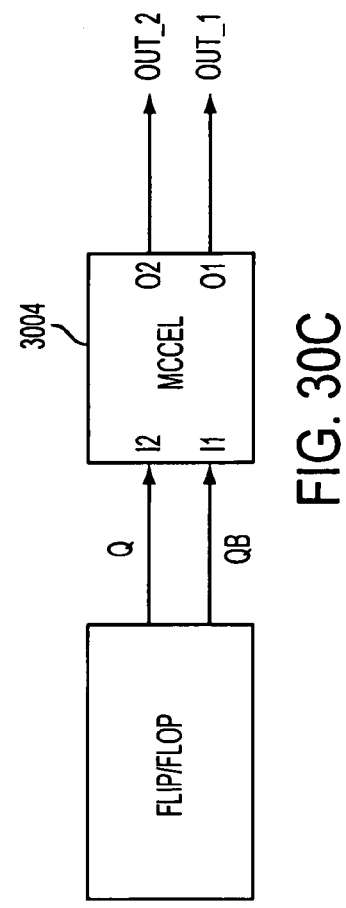
| OUT_1 | OUT_2 | COMMENT |
|---|---|---|
| OUT | OUT | DEFAULT |
| OUTB | OUT | METAL/VIA CHANGE |
FIG. 30B
| OUT1 | OUT2 | COMMENT |
|---|---|---|
| Q | QB | DEFAULT |
| QB | Q | METAL/VIA CHANGE |
FIG. 30D
FIG. 30A
FIG. 30C

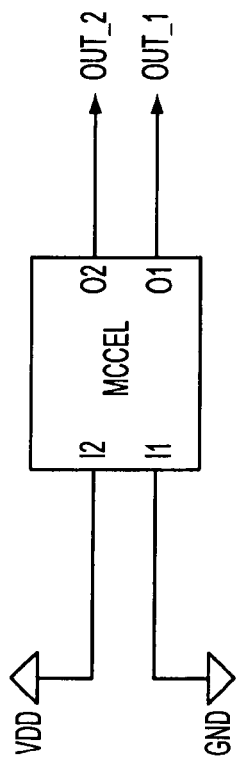
FIG. 31B
FIG. 31A
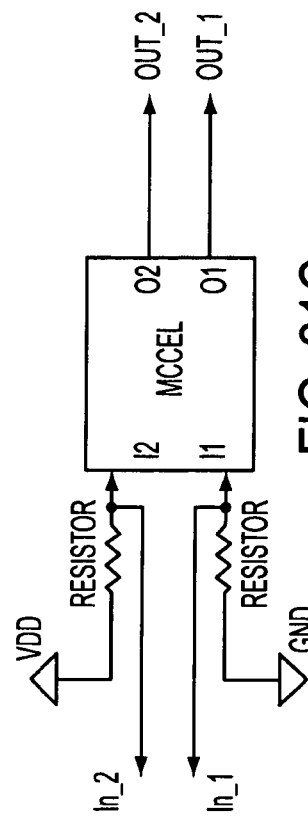
FIG. 31D
FIG. 31C

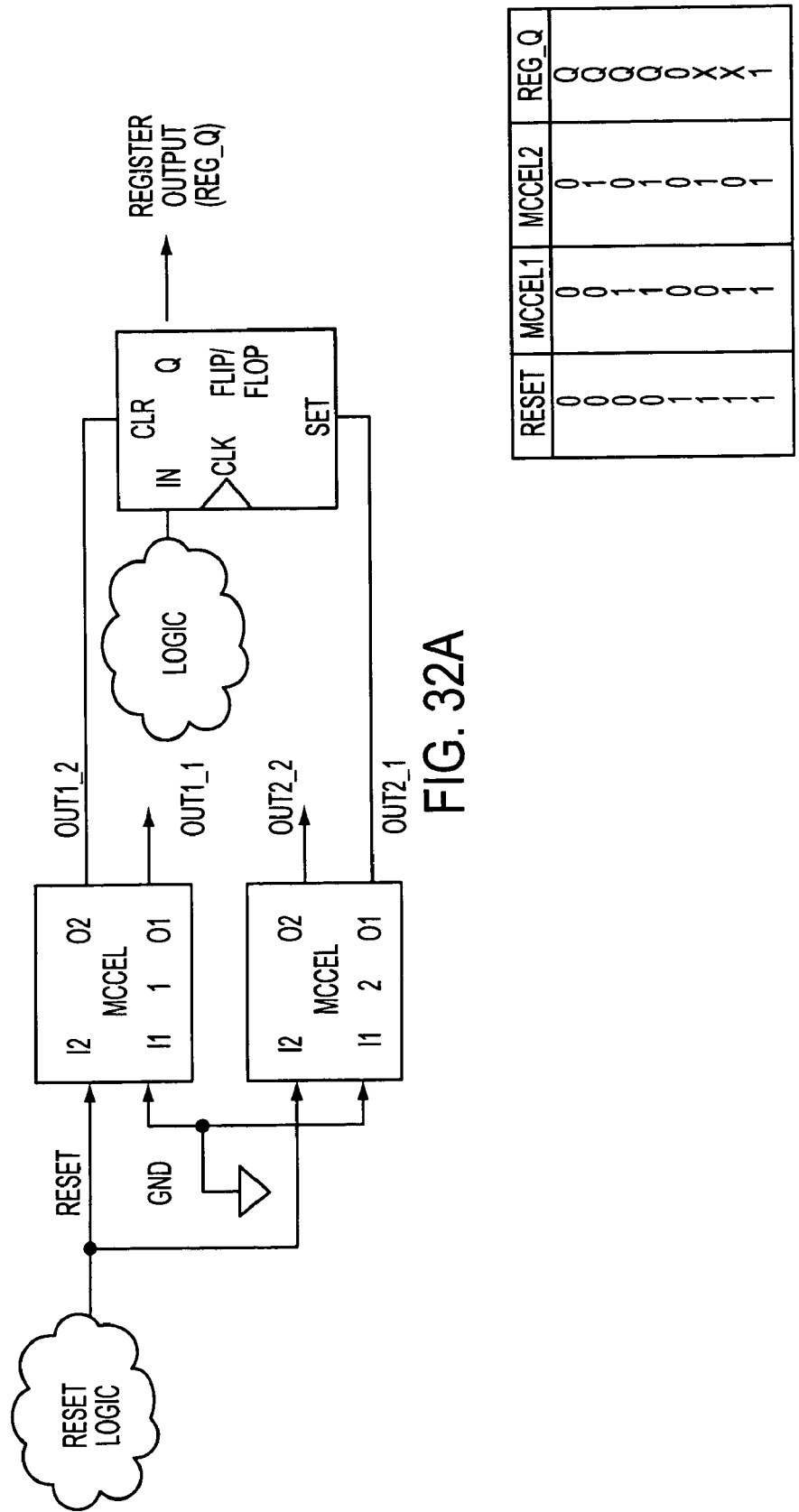

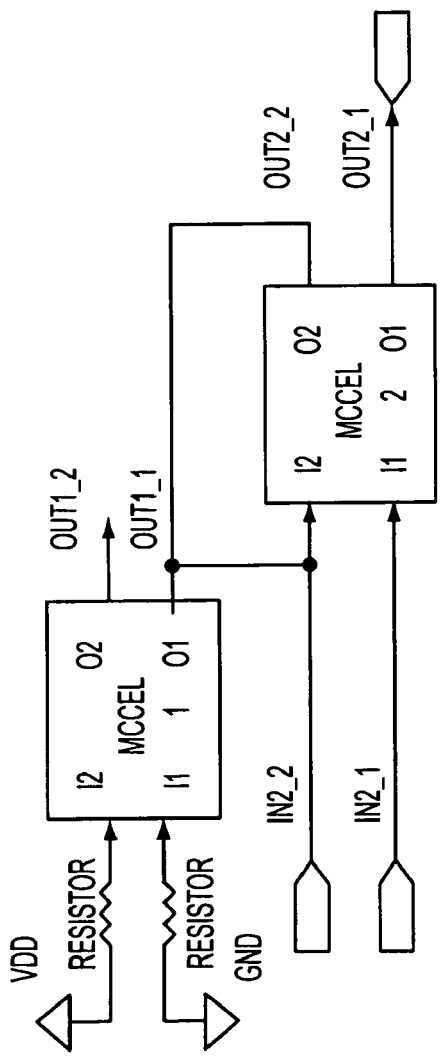

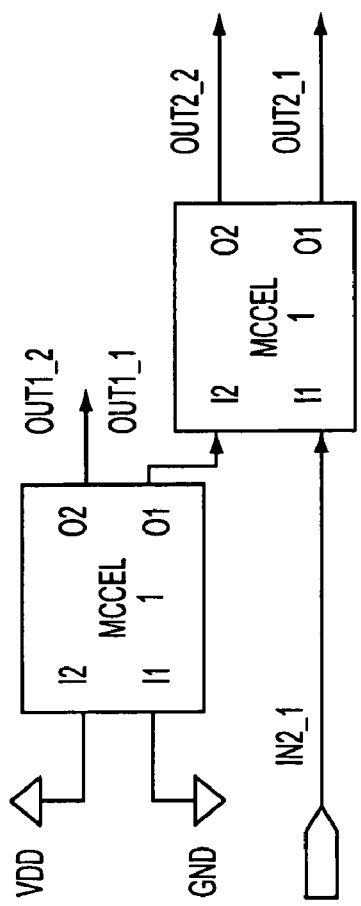

COUPLING OF SIGNALS BETWEEN ADJACENT FUNCTIONAL BLOCKS IN AN INTEGRATED CIRCUIT CHIP

CROSS-REFERENCE TO RELATED APPLICATIONS

This application claims priority to U.S. Prov. App. Nos. 60/477,338 filed Jun. 11, 2003, and 60/488,800 filed Jul. 22, 2003, each entitled "MEMORY CELL FOR MODIFICATION OF REVISION IDENTIFIER AND/OR DEFAULT REGISTER VALUES IN AN INTEGRATED CIRCUIT CHIP AND METHOD FOR MANUFACTURING SAME," and which are incorporated by reference herein in their entirety.

This application is related to U.S. application Ser. No. 10/697,079, entitled "MEMORY CELL FOR MODIFICATION OF REVISION IDENTIFIER IN AN INTEGRATED CIRCUIT CHIP"; U.S application Ser. No. 10/697,889, entitled "METHOD FOR MANUFACTURING A MEMORY CELL FOR MODIFICATION OF REVISION IDENTIFIER IN AN INTEGRATED CIRCUIT CHIP"; and U.S application Ser. No. 10/697,286, entitled "MEMORY CELL FOR MODIFICATION OF DEFAULT REGISTER VALUES IN AN INTEGRATED CIRCUIT CHIP", all filed concurrently herewith, which are all incorporated by reference herein in their entirety.

BACKGROUND OF THE INVENTION

1. Field of the Invention

The present invention is directed to integrated circuit (IC) chips, and more particularly to coupling of power, control and data signals between adjacent functional blocks in an IC.

2. Related Art

An embodiment of the present invention provides a solution to a problem that plagues conventional integrated circuit (IC) chips. The problem is the hidden cost of additional metal mask layers when implementing a revision identification (ID) of the chip. This is a necessary requirement in order to inform a customer through software that the existing design of the chip has changed.

Conventionally, the revision ID is implemented as bits that are tied to either VDD (supply) or GND (ground) at any arbitrary layer of the chip. An additional metal layer is consumed by the revision ID when actual design changes are made on a different metal layer than where the revision ID was originally connected. For example, an additional metal layer will be consumed if the chip requires a logic fix on the metal 2 layer and the next revision ID bit needs to be tied to GND (ground) on the metal 4 layer. This will require two metal mask layer changes instead of just one on the metal 2 layer. Modification to the metal 4 layer is not necessary if the Revision ID could be changed in the metal 2 layer. In 0.18 μm technology, the cost per metal layer is high, and in 0.13 μm technology, the cost is even higher. Hence, the cost increases for finer pitch technology.

Additional costs also result from the engineering hours spent on the laborious layout task of minimizing the number of metal layers used to implement a change in the revision ID. For example, this task may consume a number of days just to save a metal mask. In addition, completely unique designs must be implemented for each chip in order to save mask costs. As a result, these designs cannot be re-used for other projects.

Significant cost savings for a company can be attained if one could completely eliminate the waste of mask layers and extra labor due to revision ID bit changes. This is a problem that affects a vast number of conventional IC chips.

Modifiable revision ID schemes exist, such as those described in U.S. Pat. Nos. 5,590,069 and 5,644,144, which are incorporated by reference herein in their entirety. The schemes disclosed in these two patents suffer from inefficient topological layouts.

Thus, what is needed is an integrated circuit structure that permits coupling of power, control and data signals between adjacent functional blocks, at minimal chip real-estate expense.

BRIEF SUMMARY OF THE INVENTION

The present invention is directed to a modifiable circuit for coupling at least two adjacent logic blocks in an integrated circuit chip, wherein the chip includes a plurality of metal layers, and first and second power supply potentials. The circuit comprises a first and second metal interconnect structures, and an interconnect. The first metal interconnect structure traverses the plurality of metal layers using a first plurality of vias, wherein the first metal interconnect structure is located at a boundary of the at least two adjacent logic blocks. The second metal interconnect structure traverses the plurality of metal layers using a second plurality of vias, wherein the second metal interconnect structure is located at the boundary of the at least two adjacent logic blocks. The interconnect is formed between the at least two adjacent logic blocks by at least one of the first and second metal interconnect structures, wherein a state of the interconnect is programmable by altering any one of the plurality of metal layers or any one of a plurality of via layers.

The first metal interconnect structure can be coupled to one of the first and second supply potentials and the second metal interconnect structure is coupled to the other one of the first and second supply potentials.

Prior to programming, the first and second metal interconnect structures can be coupled at a top metal layer.

In another embodiment, multiples of the first and second metal interconnect structures are coupled together to form a plurality of modifiable cycles, wherein each half cycle is modifiable at least once. In an alternative implementation, one cycle can be laid-out to form a ladder structure that traverses the plurality of metal layers from a bottom metal layer to a top metal layer and back to the bottom metal layer. The ladder structure can be arranged to form a cube-shaped structure. In this arrangement, the first and second supply potentials can comprise two buses located in a central region of the cube-shaped structure and are accessible at each of the metal layers. Alternatively, the ladder structure can be arranged to form a spiral-shaped structure. In this other arrangement, the first and second supply potentials can comprise buses accessible at each of the metal layers.

In an embodiment, each of the first and second metal interconnect structures can be reprogrammed repeatedly by altering any one of the plurality of metal layers.

In another embodiment, each of the first and second metal interconnect structures can be reprogrammed repeatedly by altering any one of a plurality of via layers.

In still a further embodiment, each of the first and second metal interconnect structures can be reprogrammed repeatedly by altering any one of the plurality of metal layers and any one of a plurality of via layers.

One of the first and second metal interconnect structures is coupled to the first supply potential at a bottom metal layer and the other of the first and second metal interconnect structures is coupled to the second supply potential at the bottom metal layer to provide a dual output arrangement.

The memory cells of the present invention can be inserted into subsequent versions of previously designed chips. For example, chips that have been fabricated and whose base layers are already fixed can receive the memory cells of the present invention during an all-metal change provided that sufficient chip space is available. This drop-in compatibility permits chip designers to enable or disable logic fixes in one metal or one via layer through use of memory cells of the present invention, which can reduce design risks due to cost.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 7A illustrates a basic layout structure for an enhanced dual output MMCEL according to the present invention.

FIGS. 11A–D illustrate MMCEL layout edit rules for metal changes according to the present invention.

FIGS. 12A–12D describe MMCEL via edit rules according to the present invention.

Figure 13:
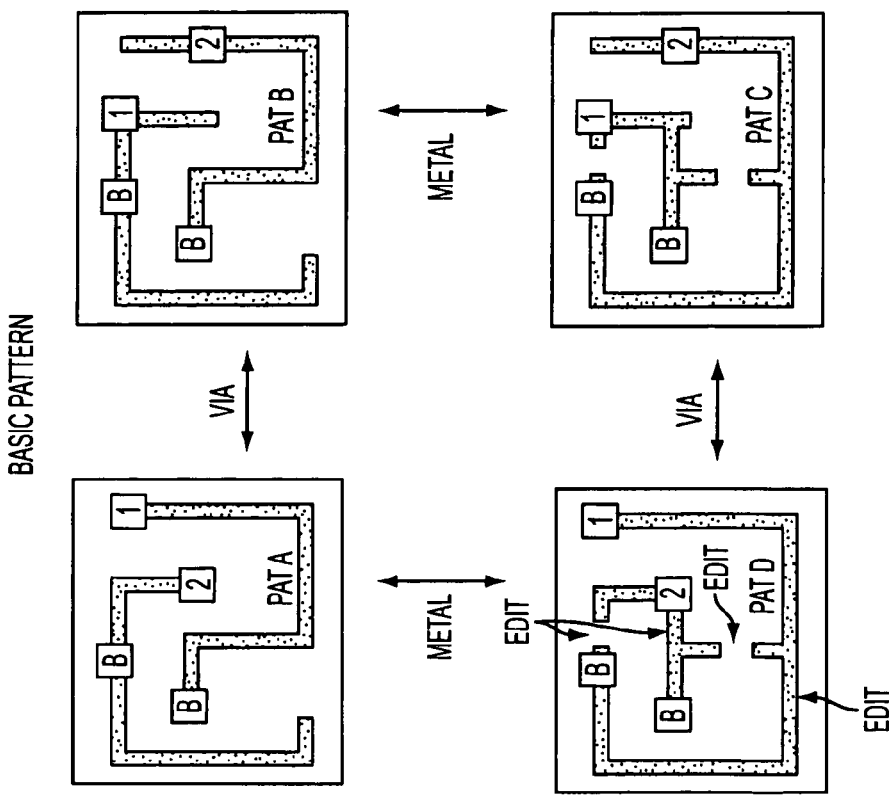

FIG. 13 illustrates MMCEL basic pattern layout permutations according to the present invention.

Figure 14:
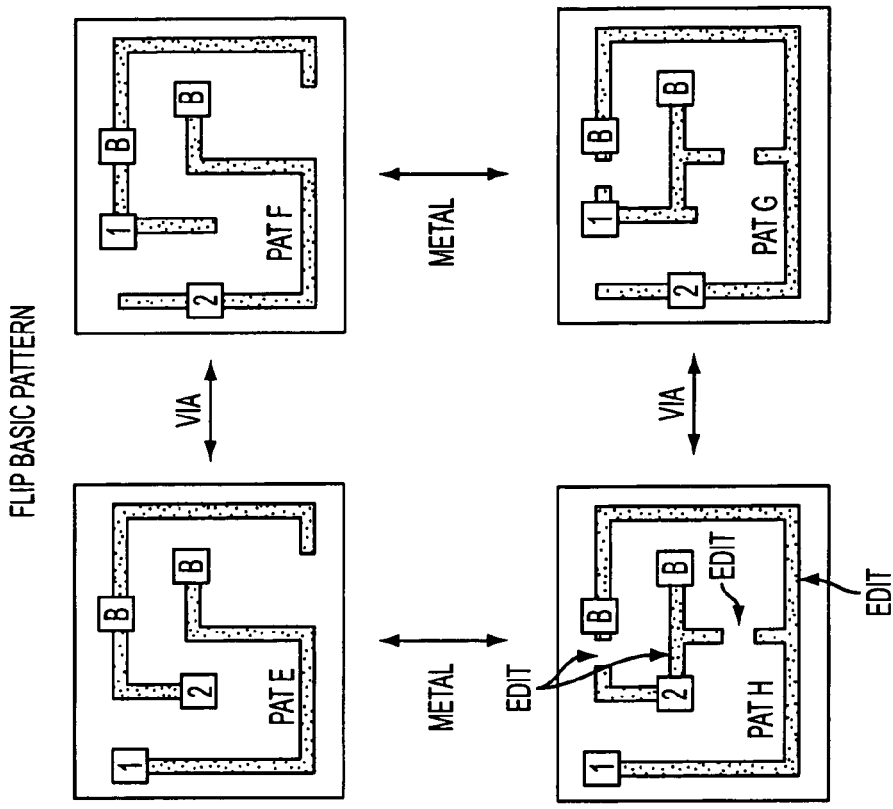

FIG. 14 illustrates an MMCEL flip basic pattern layout permutation according to the present invention.

FIGS. 15A–15D illustrate a triple metal MMCEL stack layout example according to the present invention.

FIGS. 16, 17A–C, 18A–C, 19A–C, 20A–C and 21A–C illustrate an MMCEL layout in a six metal layer implementation according to the present invention.

Figure 22:
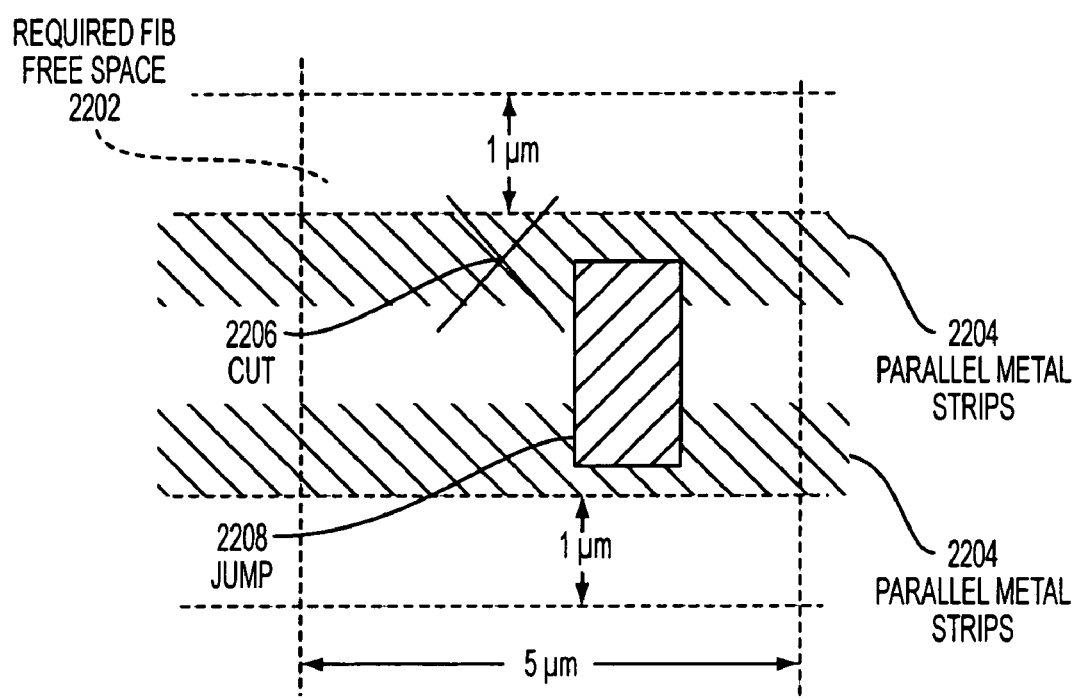

FIG. 22 illustrates the use of FIB technology for programming the MMCEL of the present invention.

Figure 23:
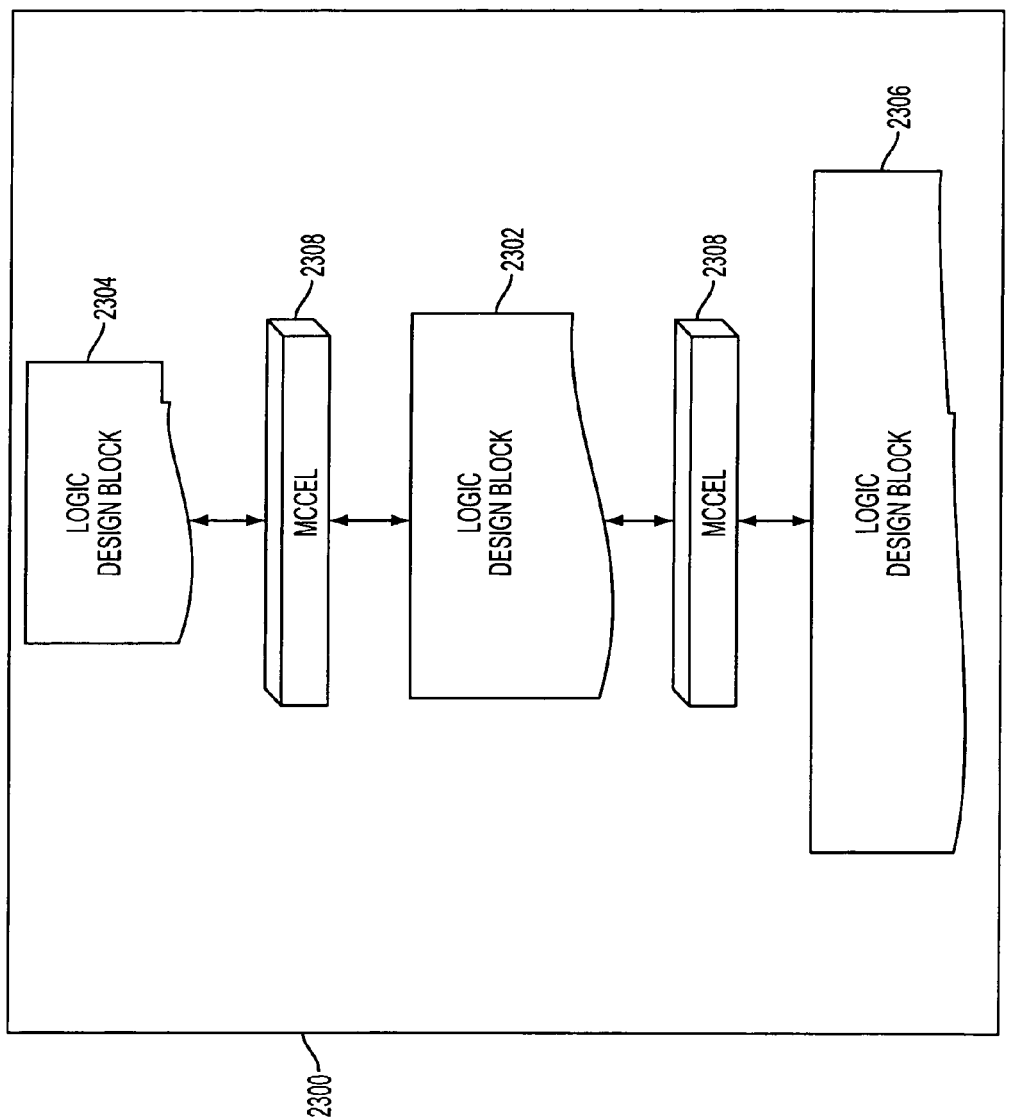

FIG. 23 illustrates meta-connect cells (MCCEL) according to the present invention.

FIGS. 24A, 24B, 25, 26A–26D, 27A, 27B, 28, 29, 30A–30D, 31A–31D, 32A, 32B, 33A, 33B, 34A, 34B, 35, 36A, 36B, 37A and 37B illustrate circuits employing MCCEL and/or MMCELs according to the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

The preferred embodiment of the present invention will now be discussed in detail. While specific features, configurations and arrangements are discussed, it should be understood that this is done for illustration purposes only. A person skilled in the relevant art will recognize that other steps, configurations and arrangements or devices may be used to achieve the features of the invention without departing from the spirit and scope thereof. Indeed, for the sake of brevity, conventional electronics, manufacturing of semiconductor devices, and other functional aspects of the method/apparatus (and components of the individual operating components of the apparatus) may not be described in detail herein.

The terms chip, integrated circuit, monolithic device, semiconductor device, and microelectronic device are often used interchangeably in this field. The present invention is applicable to all the above as they are generally understood in the field.

The material commonly used to form conductors in semiconductor integrated circuit chips is metal, such as copper, aluminum, various alloys, polycrystalline silicon (polysilicon), and the like. The term "metal" will be used herein to cover any type of conductor, including but not limited to the foregoing metals and polysilicon. The terms conductive line or path, strips and traces are used interchangeably herein to refer to a metal conductor. Metal layers will be referred to by number, such as M3 for metal layer three, and so on.

The term "via" as used herein refers to an area or opening in a dielectric layer that provides an electrical pathway from one metal layer to the metal layer above or below. The electrical pathway comprises a metal that fills the via. Alternatively, the via walls are made conductive.

Further, background material concerning semiconductor solid-state physics and manufacturing can be found in a number of publicly available references including two books by S. M. Sze, titled: Physics of Semiconductor Devices, John Wiley and Sons, Inc., New York (1981), and Semiconductor Devices, Physics and Technology, John Wiley and Sons, Inc., New York (1985), both of which are incorporated herein by reference.

It should be understood that the spatial descriptions (e.g., "above", "below", "up", "down", etc.) made herein are for purposes of illustration only.

The invention is directed to a circuit, called a Meta-Memory Cell (MMCEL), to facilitate the modifications of the revision ID bits at any metal or via layer. The required number of metal layers for the next design iteration is greatly reduced by the MMCEL because the revision ID bit changes can be made on the same metal layer as the logic design fix.

The MMCEL resembles a hard-wired memory cell with dual complementary outputs. The MMCEL utilizes all layers of metal including metal vias to fully meet its design requirement. Unlike a silicon-based non-volatile programmable memory, the MMCEL does not require active silicon (i.e., the base layers) to retain a programmed logic value. Instead, it relies only on the alteration of any single metal or via layer for re-programming.

When inserted into existing chip designs, only one metal or via layer change is required to utilize the MMCEL.

The following figures and accompanying description more fully describe the present invention.

Figure 1:
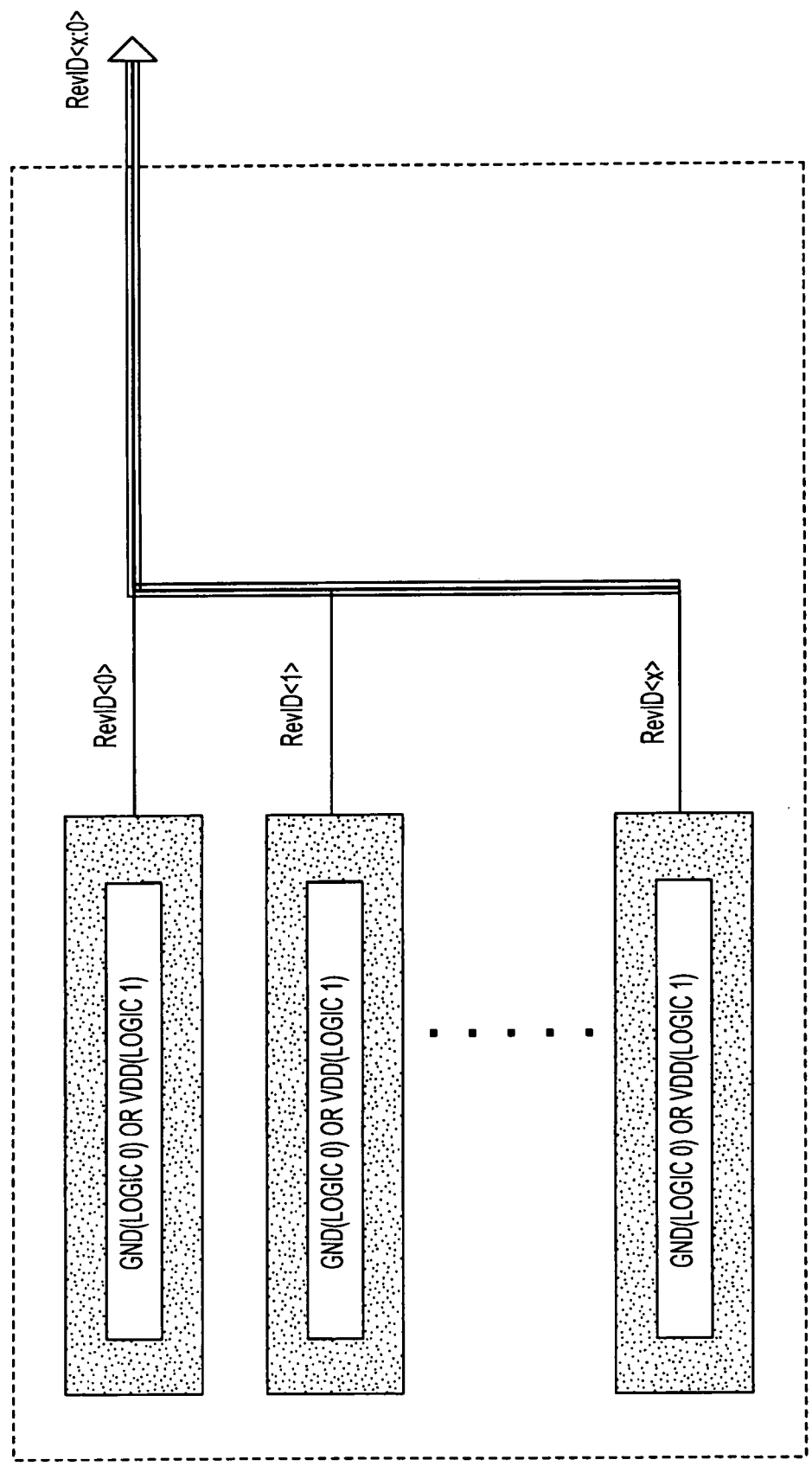
FIG. 1 illustrates a schematic block diagram of revision identification (ID) bits.

FIG. 1 illustrates a schematic block diagram of revision identification (ID) bits. A plurality of revision ID bits RevID <0> through RevID <x> are combined to form a revision identification word RevID<x:0>. The revision identification word typically comprises 8 bits, but may comprise 16 bits, 32 bits, or the like, as would be apparent to a person having ordinary skill in the art.

Figure 2:
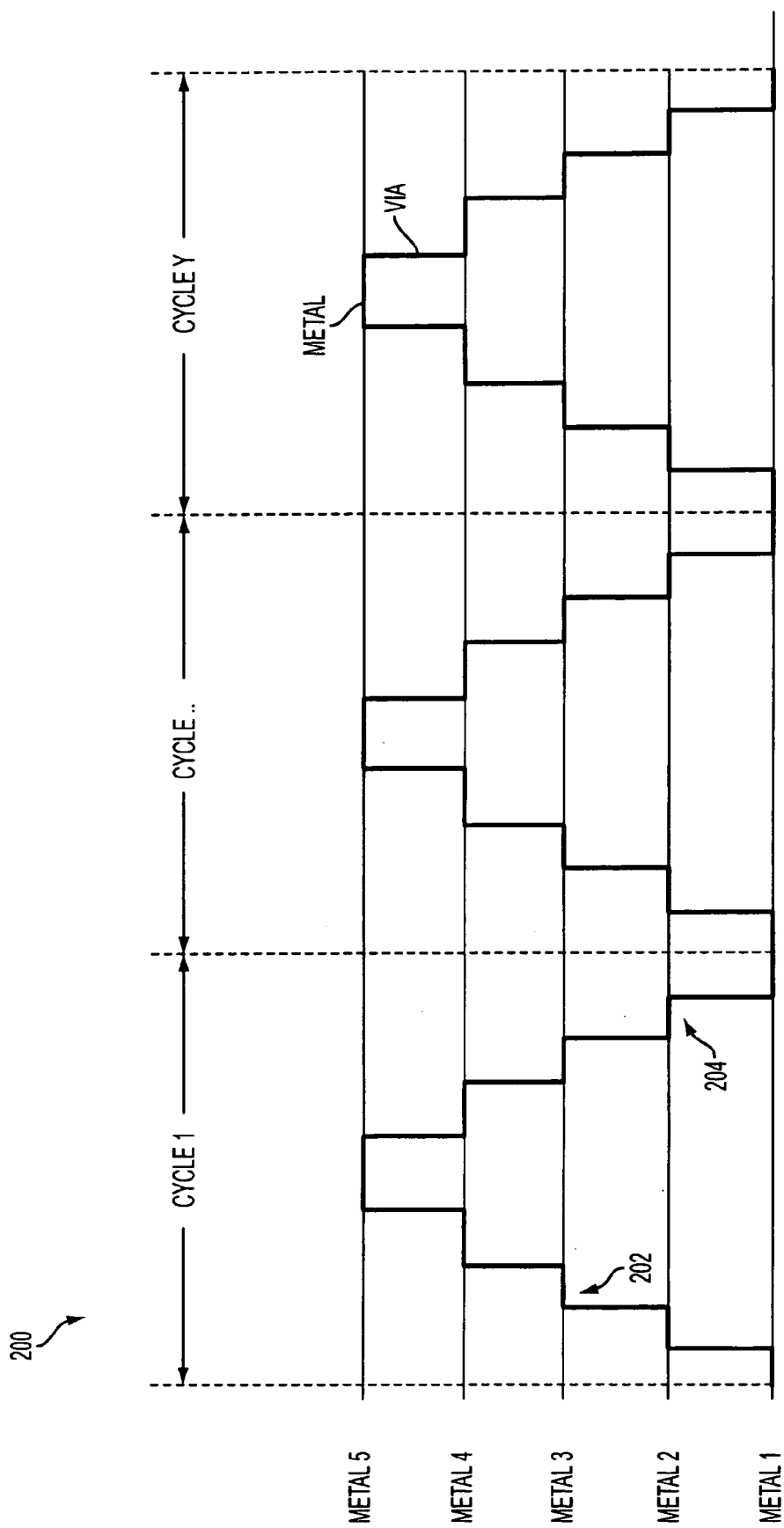
FIG. 2 illustrates a meta-memory cell (MMCEL) according to an embodiment of the present invention.

FIG. 2 illustrates a single meta-memory cell (MMCEL) according to an embodiment of the present invention. According to this embodiment, MMCEL 200 comprises cycles 1 through Y. Each MMCEL cycle comprises two ladders (e.g., 202 and 204) that traverse layers of an integrated circuit (five metal layers are depicted, for example). Each horizontal rung of the serpentine ladder structure is formed of metal traces at any one of metal layers 1–5 (M1–M5). Each vertical rung of the ladder structures comprises a via formed in a material layer between any two adjacent metal layers, as would also be apparent to a person having ordinary skill in the art.

A plurality of MMCELs (each comprising a given number of cycles) form a single revision identification word. For example, an 8 bit revision identification word would comprise eight MMCELs.

The number of whole cycles that an MMCEL has depends on the number of revisions a integrated circuit designer contemplates for a given integrated circuit during the production life of that integrated circuit.

Figure 3A:
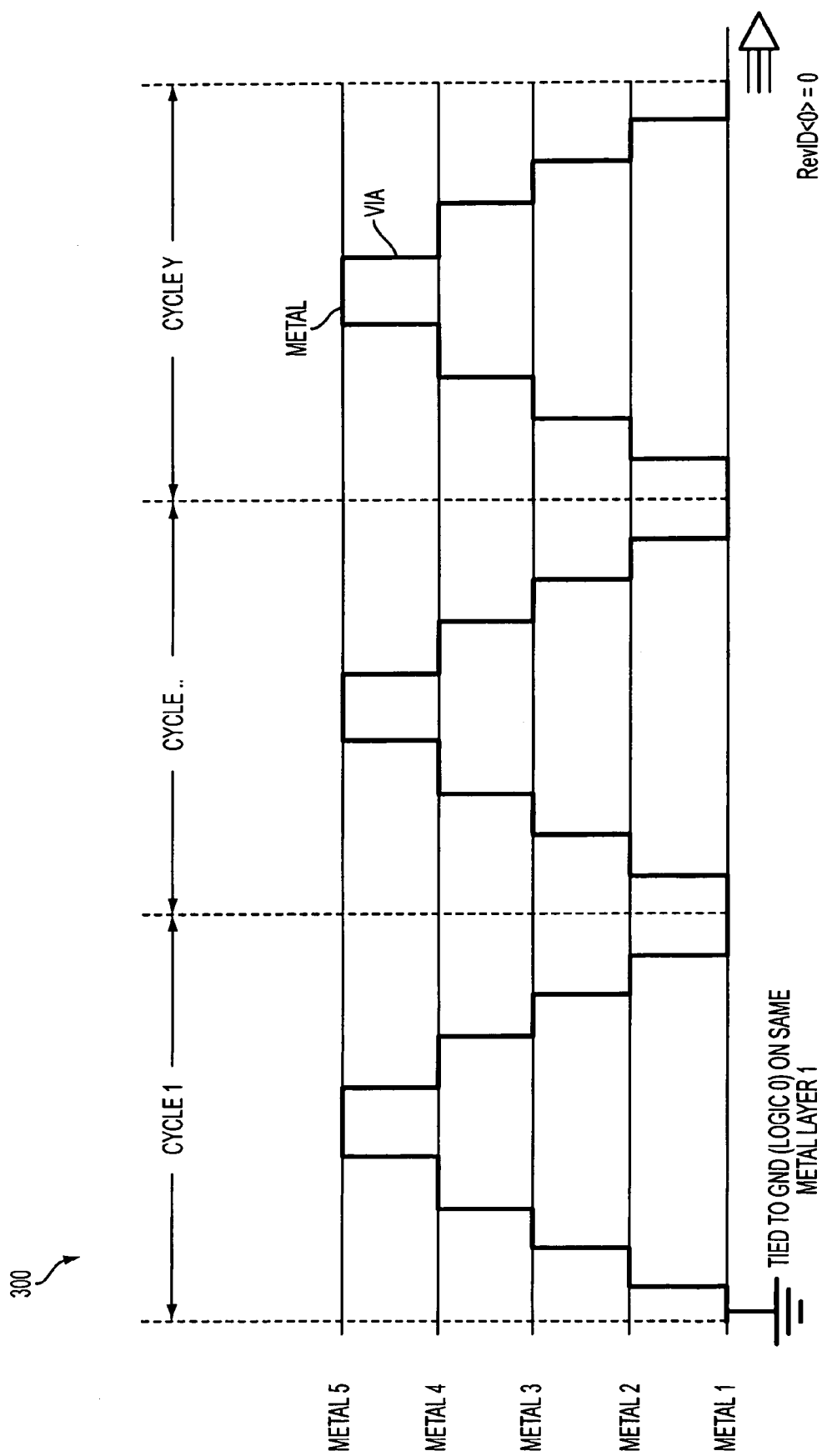
FIGS. 3A–3C illustrate an MMCEL according to the present invention.

FIG. 3A illustrates an MMCEL having the beginning of cycle one tied to ground (logic 0) at M1. The output of this MMCEL 300 is provided at the end of cycle Y, also at M1, and provides revision ID output RevID <0>. Thus, the output of MMCEL 300 is a logic 0.

Figure 3B:
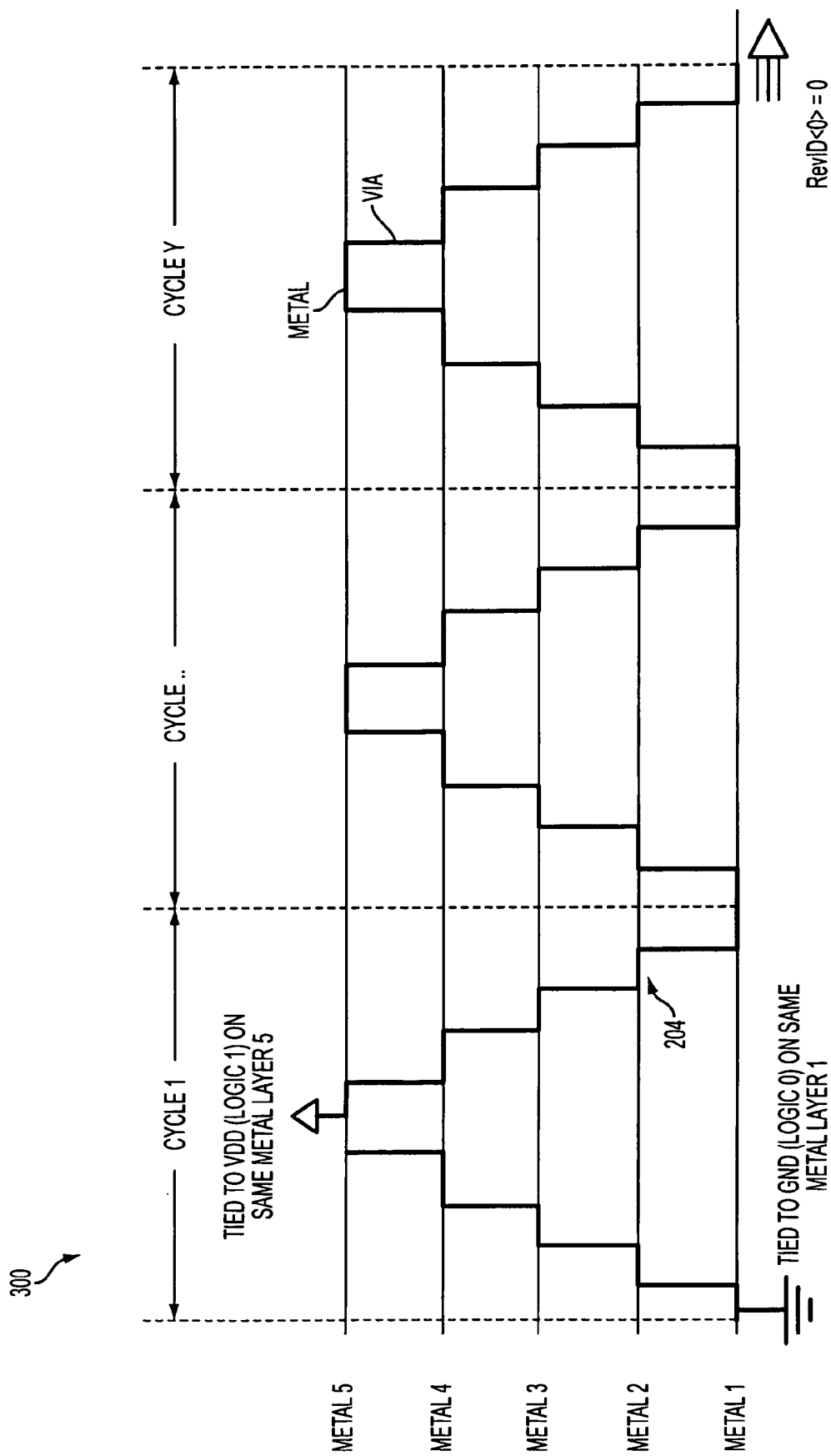

FIG. 3B illustrates a modification to MMCEL 300. In order to change the value of MMCEL 300 output RevID <0> during a later revision of the integrated circuit, the interconnected metal ladders of cycles one through cycle Y must be changed. In this example, the first revision to the integrated circuit is performed in cycle one of MMCEL 300. Assuming that a revision to the integrated circuit is made to the mask corresponding to M5, this layer will be used to modify the revision bit. This avoids having to make modifications to any other mask in the manufacturing process. In this case, the metal trace at cycle one on M5 is tied to a power supply (e.g., VDD or logic 1). Tying the ladder 204 of cycle one to VDD inverts the output of MMCEL 300 from logic 0 to logic 1.

Providing each cycle of the MMCEL with two ladders permits at a minimum of two revisions per cycle of the MMCEL. For example, an MMCEL comprising three full cycles can be modified a minimum of 6 times in order to implement numerous modifications to the revision bit. More revisions per cycle are possible, depending on which metal layers are modified and in what order per chip revision.

Figure 3C:
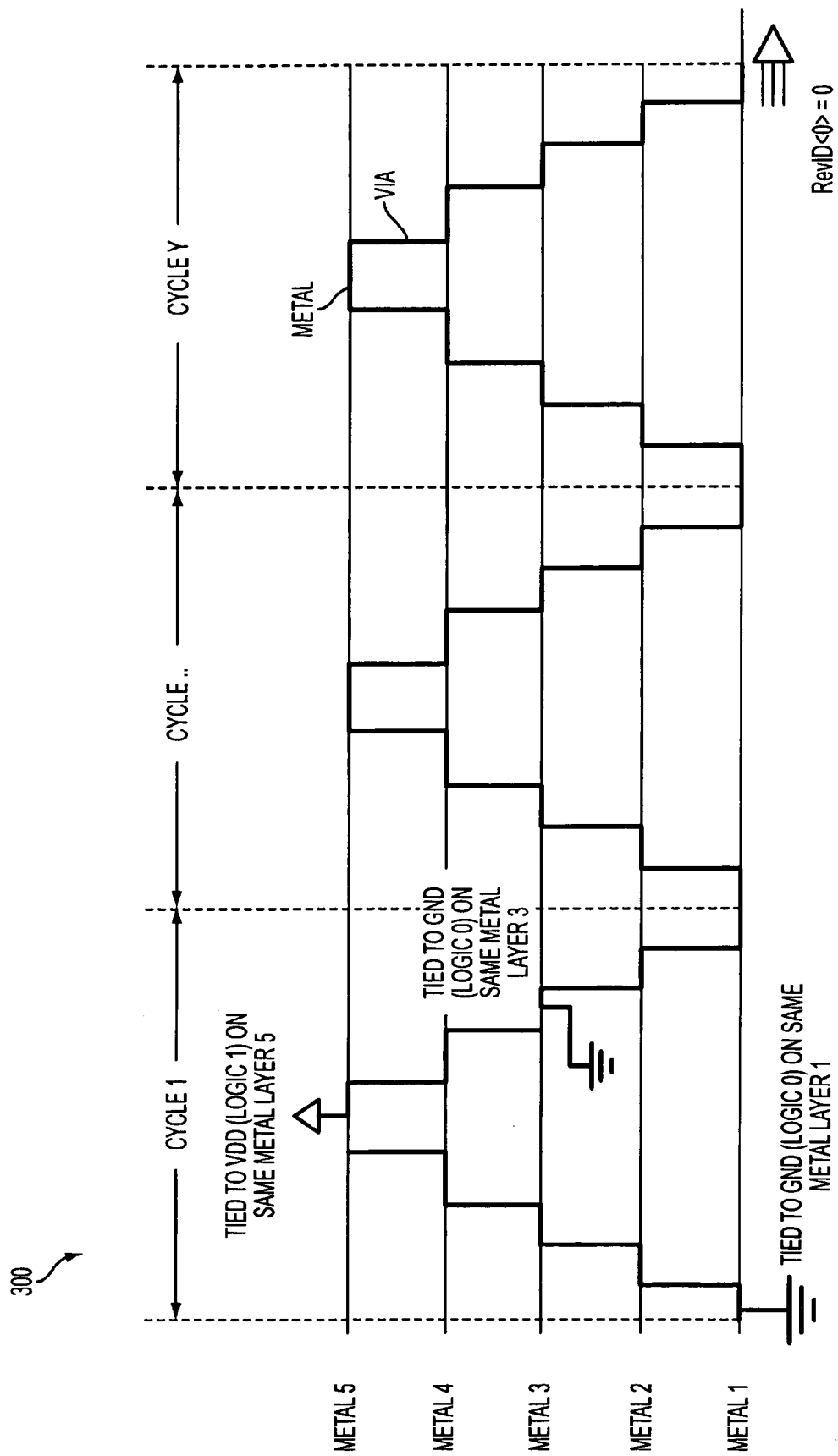

FIG. 3C illustrates another revision to cycle one in which ladder 204 is tied to ground (logic 0) on M3. This change causes the RevID <0> value to invert from logic 1 (as shown in FIG. 3B) back to logic 0.

Figure 4:
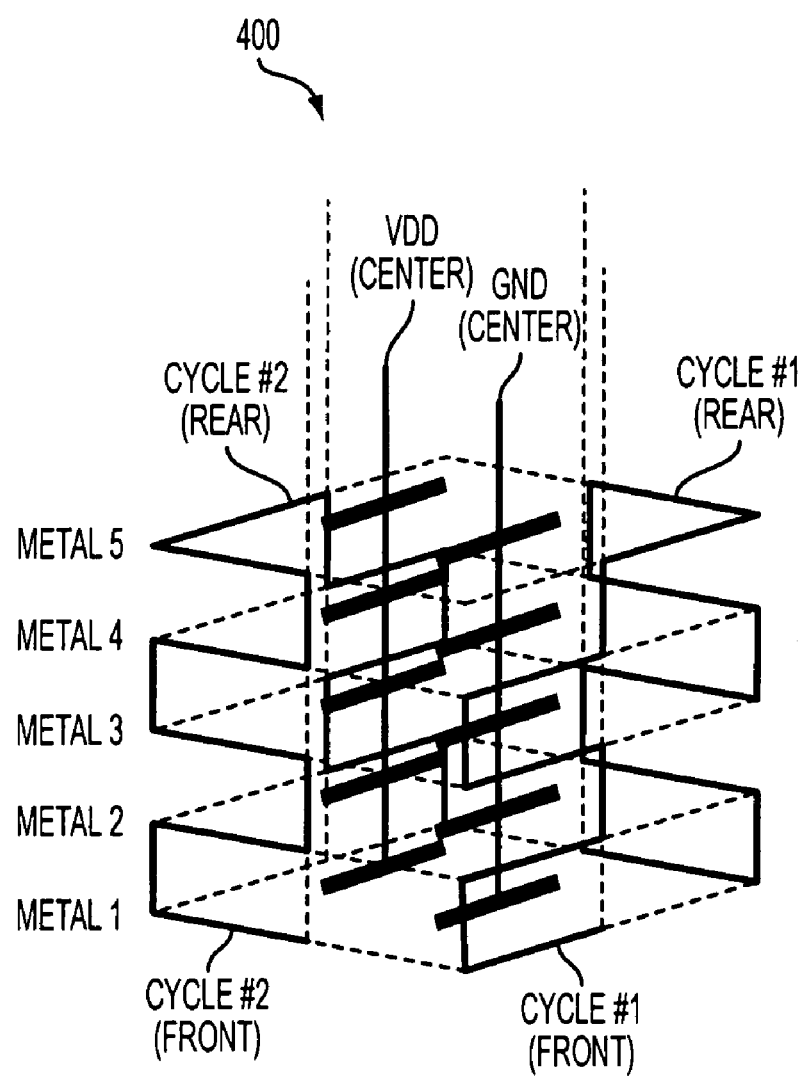
FIG. 4 illustrates another MMCEL embodiment according to the present invention.

Another MMCEL embodiment is illustrated in FIG. 4. Rather than the serpentine ladder illustrated in FIGS. 2 and 3A–C, the MMCEL of FIG. 4 is laid out in the shape of a 3-dimensional (3-D) cube. MMCEL 400 comprises two cycles. Power (VDD) and ground (GND) buses are formed in the center of the 3-D cube layout. This permits access to power and ground by any of the four half cycles at any of the metal layers M1–M5. Alternatively, power and ground buses can be placed external to the main structure. The internal metal widths of the traces should be wide enough to accommodate a low resistant path between this MMCEL and any adjacent circuit. Due to long trace routs when using this MMCEL structure, designers should be aware of the resistance-capacitance (RC) delay and its consequences within the integrated circuit. Buffers can be added within the structure as necessary to improve signal transmission along long routing paths, as would be apparent to a person having ordinary skill in the art.

Figure 5A:
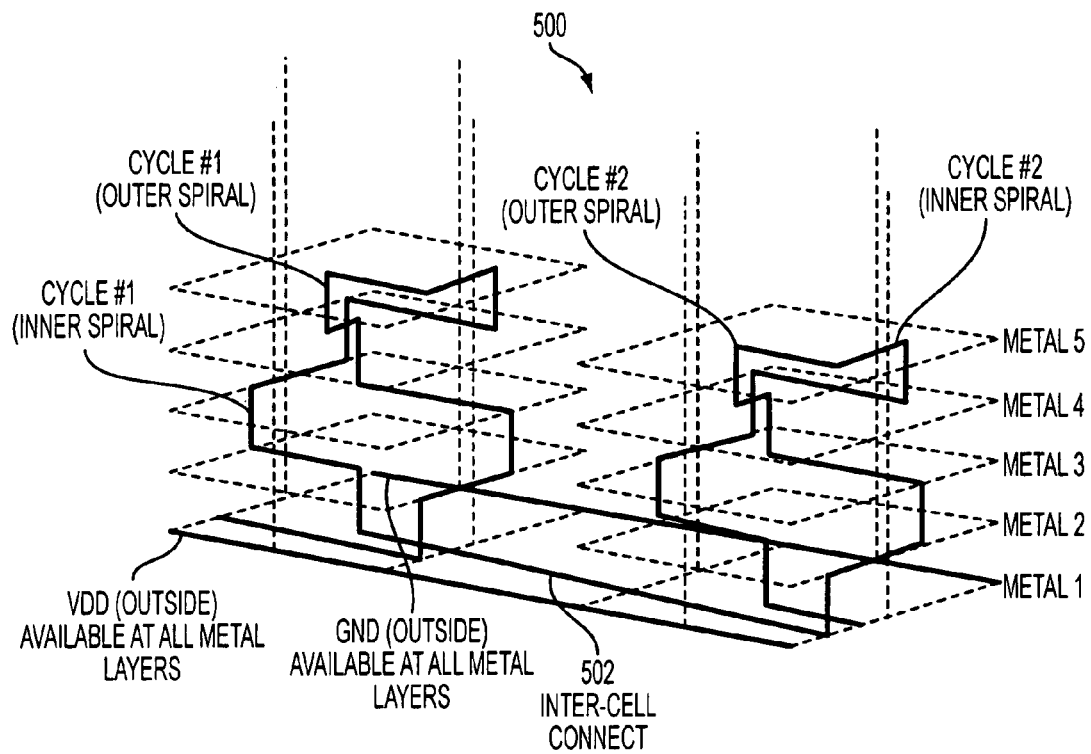
FIGS. 5A and 5B illustrate a 3-D spiral layout for an MMCEL 500 according to the present invention.
Figure 5B:
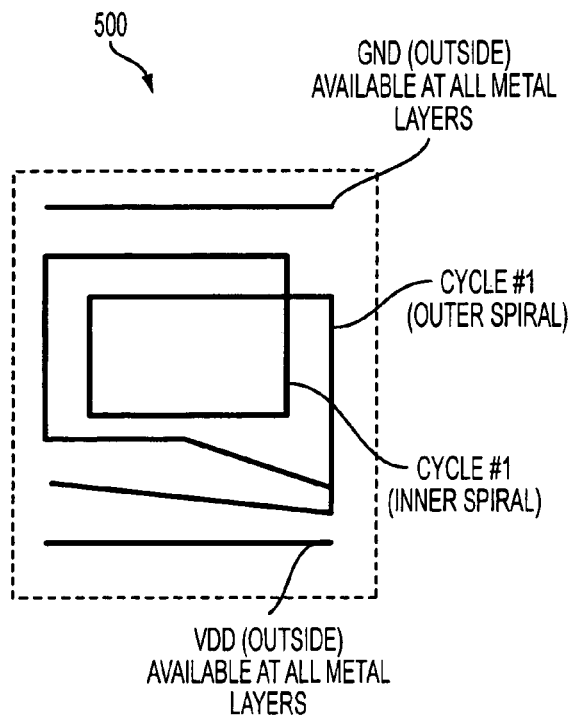

FIGS. 5A and 5B illustrate a 3-D spiral layout for an MMCEL 500. The spiral approach allows stacking of cycles to create greater than two cycles per cell as compared to MMCEL 400 of FIG. 4, for example. The power and ground buses are made available along the outside of the cell. Only two power and ground buses are illustrated at metal layer one in FIGS. 5A and 5B to simplify the drawing. However, power and ground buses should be provided at all metal layers for optimum programmability of the revision bit. An inter-cell connect trace is illustrated at 502, which couples cycle number one and cycle number two.

The present invention simplifies the layout by eliminating the tedious work of routing the revision identification on the same layer as the design modifications to the integrated circuit. The layout changes are made locally at a predefined location according to the present invention. Moreover, no ERC or DRC violations occur according to the present invention because layout changes do not leave a floating metal trace; disconnected metal traces are tied to either ground or power.

Figure 6:
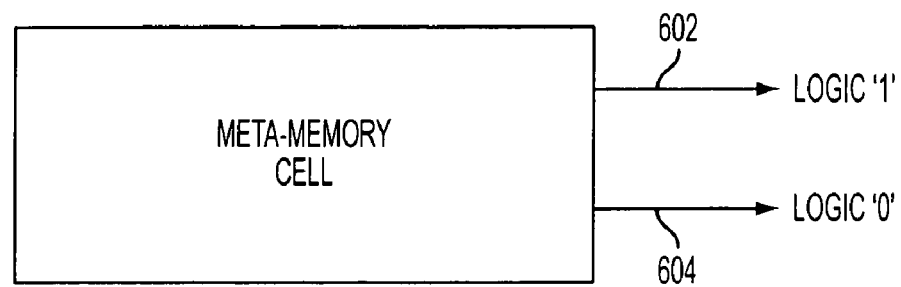
FIG. 6 illustrates a dual output MMCEL, according to the present invention.

A dual output MMCEL is illustrated in FIG. 6, according to another embodiment of the present invention. The dual output cell outputs a logic 1 and a logic 0 at outputs 602, 604, respectively. This MMCEL resembles a hard-wired memory cell with dual complementary outputs that is implemented on metal layers only. The MMCEL utilizes all layers of metal including metal vias to fully meet its design requirement.

A basic layout structure for an enhanced dual output MMCEL is illustrated in FIG. 7A. Dual output MMCEL 700 comprises 2 metal ladders 702 and 704, which traverse all metal layers of the integrated circuit, such as metal layers M1–M6, for example.

The dual parallel metal ladder structure can traverse each metal and via layer of the chip. This allows the output of the MMCEL to be inverted at any metal or via layer. In addition, the dual parallel metal ladder structure enables the MMCEL unlimited design iterations. Thus, the output of the MMCEL can be inverted as often as required.

In accordance with the dual parallel metal ladder structure of the MMCEL, one metal ladder is connected to power (VDD) at the bottom layer M1 and another metal ladder is connected to ground (GND) also at M1. Both metal ladders reach the top metal layers (for example, M5 layer for 0.18 µm technology, M6 layer for 0.13 µm technology) depending on the requirements of the user. The outputs of the MMCEL come from a top layer connection to the metal ladders, as described below.

Figure 7B:
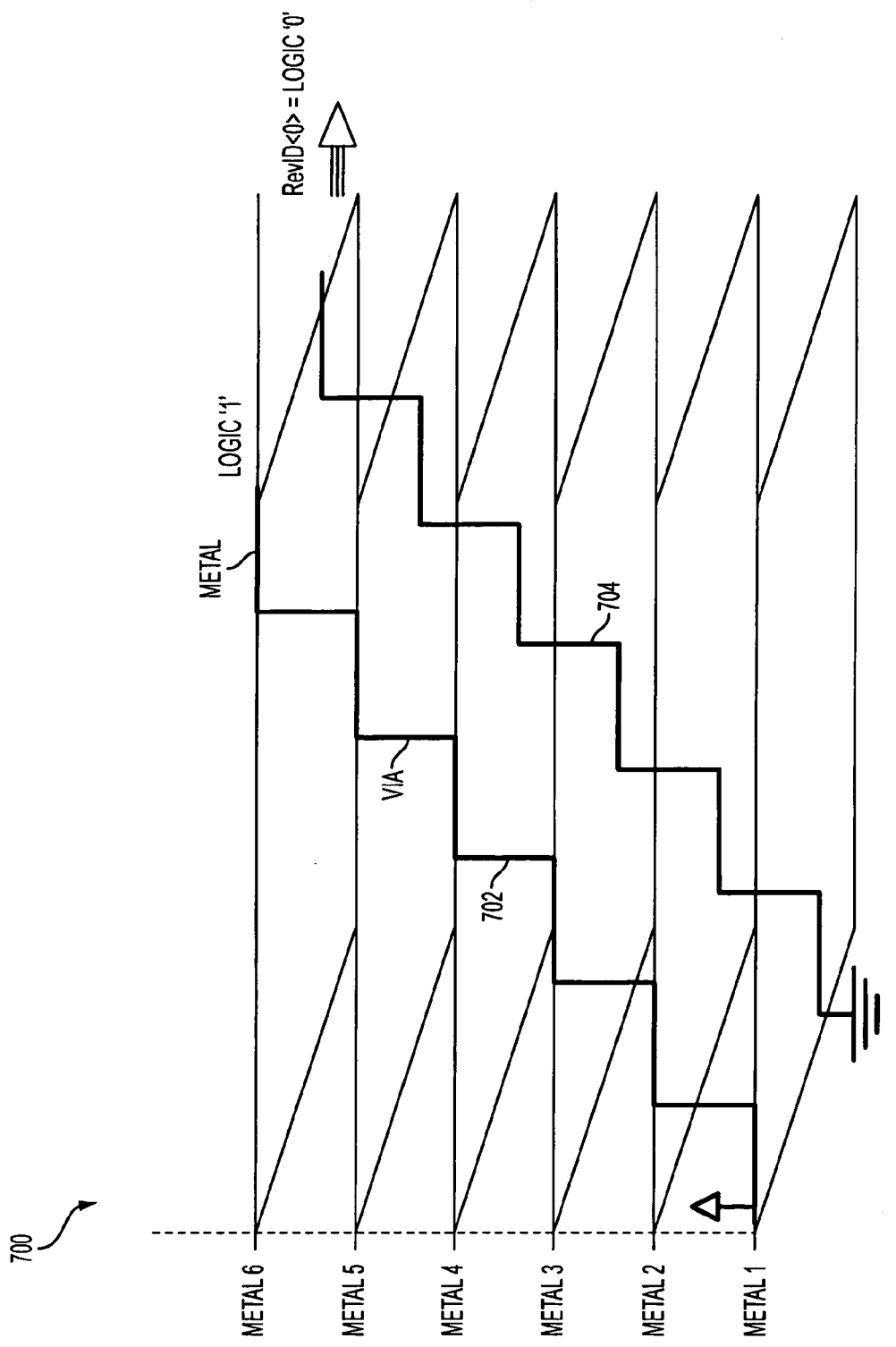
FIG. 7B illustrates MMCEL 700 with initial programming according to the present invention.

FIG. 7B illustrates MIMCEL 700 with initial programming such that ladder 702 is coupled to power (VDD) at M1 and ladder 704 is coupled to ground (GND) at M1. Coupling ladder 702 to power and ladder 704 to ground produces a logic 1 and a logic 0 output, respectively. The MMCEL output RevTD<0> can be selected at either output.

According to the present invention, the dual output MMCEL accommodates both single layer metal or single layer via changes in order to modify the output of the MMCEL. An infinite number of changes on any single layer of metal or single layer via can be performed at each cell.

Figure 7C:
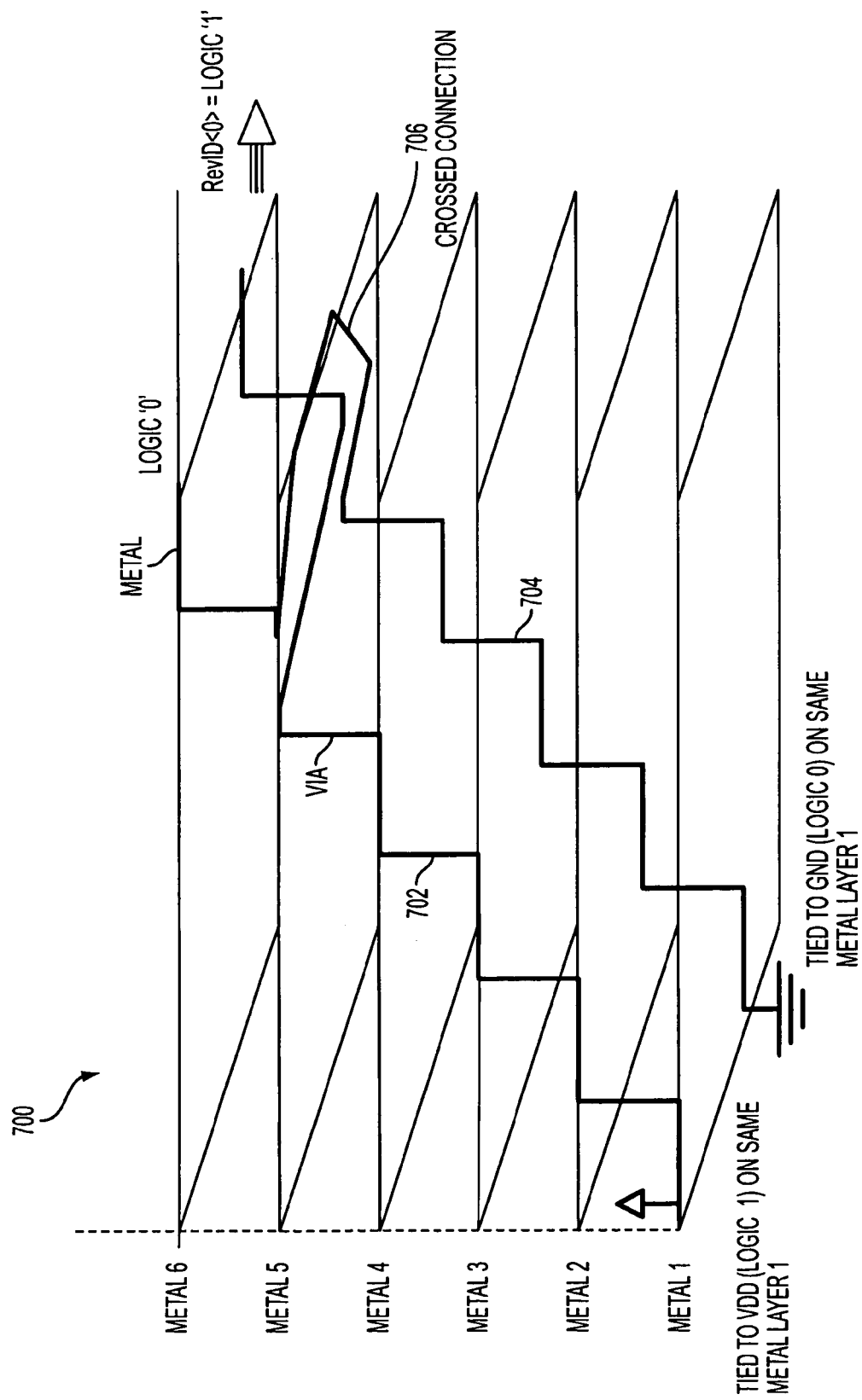
FIG. 7C illustrates a RevID<0> layout change according to the present invention.

FIG. 7C illustrates a RevID<0> layout change from logic 0 to logic 1 on M5 only. As shown at region 706, the metal traces of ladders 702 and 704 are cross-connected in order to invert both outputs of the dual MMCEL 700. This cross connection is achieved by altering the metal layer by forming two cuts and two jumps. Alternatively, the cross connection can be achieved by simultaneously moving two vias to form an alternative interconnection, as will be described below.

Figure 7D:
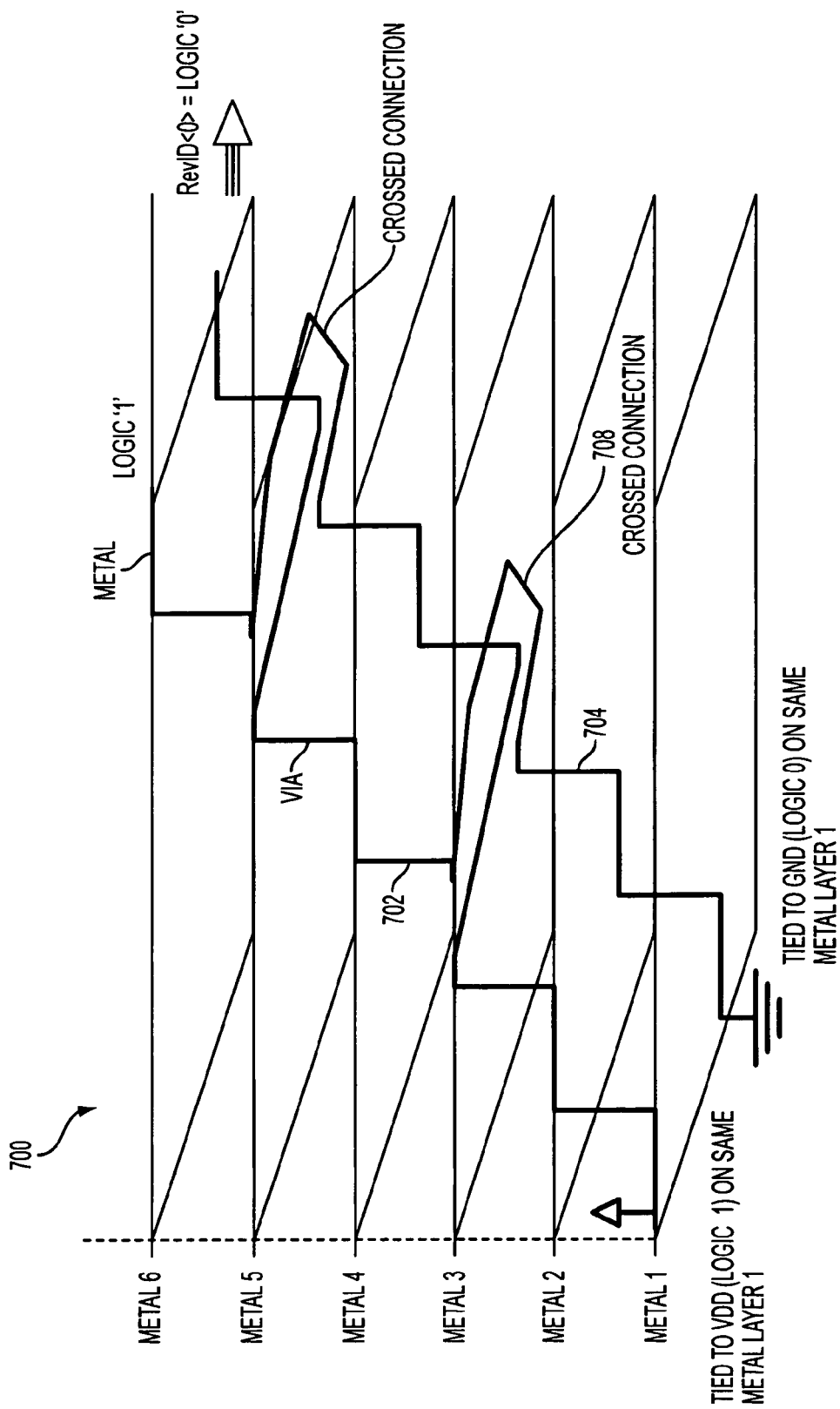
FIG. 7D illustrates a further revision of the MMCEL 700 according to the present invention.

Turning to FIG. 7D, a further revision of the MMCEL 700 can be performed at another metal layer, such as M3. Again, the metal traces of ladder 702 and 704 are cross-connected at M3, as shown generally at a region 708. This second revision of the output of MMCEL 700 returns the output of ladder 702 to a logic 1 state and the output of ladder 704 to a logic 0 state. Of course, if subsequent revisions of the integrated circuit are performed on the same metal layer the two cuts and jumps as described in connection with cross connection 706, for example, could simply be reversed in order to change the output of the MMCEL.

Figure 8A:
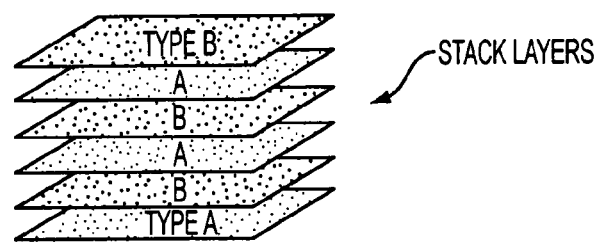
FIG. 8A shows vertically stacked MMCEL layout patterns according to the present invention.
Figure 8B:
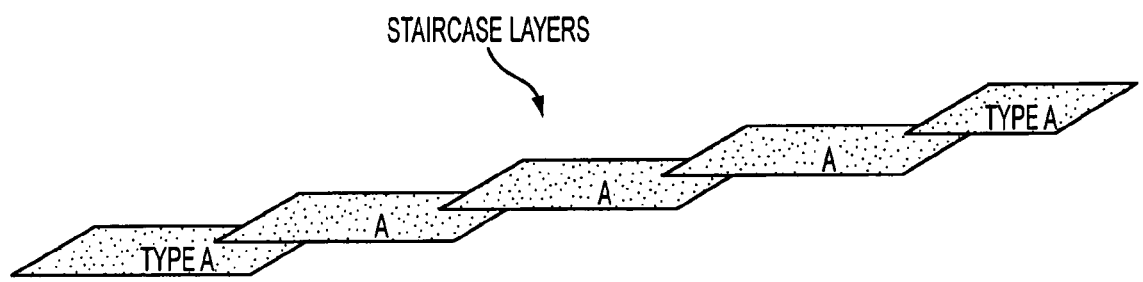
FIG. 8B shows staircase MMCEL layout patterns according to the present invention.

The dual output MMCEL of the present invention can be implemented using stacked layers of the same layout pattern. Two such stacking approaches are shown in FIGS. 8A and 8B. FIG. 8A shows a vertically stacked layer approach. The stacked structure of FIG. 8A comprises alternating layers labeled type A and type B. Type A is hereafter referred to as a normal pattern and type B as a flipped pattern. The flipped pattern B is a mirror image of the normal pattern A, as will be described below.

FIG. 8B shows a staircase of layers all having the same type A layout pattern. The staircase layer approach requires more chip real estate to implement than the stacked layer approach of FIG. 8A. Both of the stacked and staircase layer approaches are achieved by aligning the output vias of the bottom layer to the input vias of the top layer, as described below.

Figure 9A:
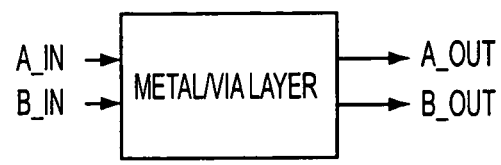
FIGS. 9A, 9B, 9C and 9D illustrate the basic MMCEL switching of the dual output MMCEL according to the present invention.
Figure 9B:
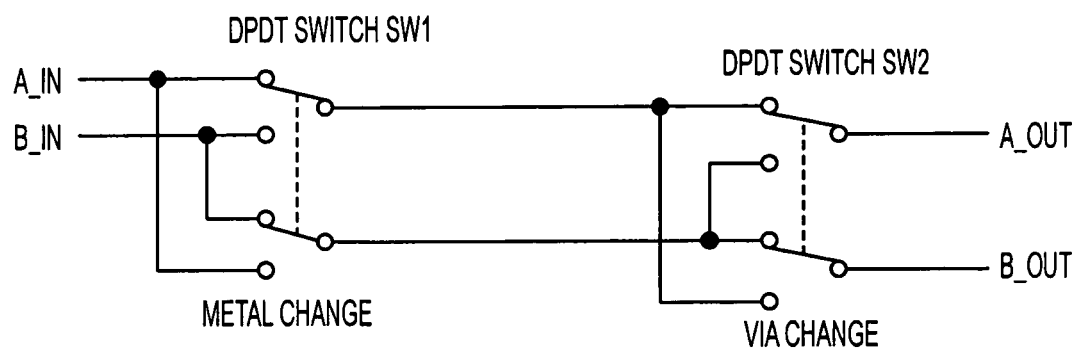

First, however, the basic switching of the dual output MMCEL will be described in connection with schematic diagrams of FIGS. 9A and 9B. An exemplary metal or via layer having two inputs (labeled A_in and B_in) and two outputs (labeled A_out and B_out). The schematic diagram of FIG. 9B shows electrically equivalent double pull double throw (DPDT) switches for each metal change or via change. DPDT switch SW1 represents a metal change and DPDT switch SW2 represents a via change. The logic convention assigned to the switches is that a switch in the 'up' position equates to a logic '0' and in the 'down' position equates to a logic '1'. The following logic table (Table 1) demonstrates how the output can be modified according to the state of switches SW2 and SW1:

TABLE 1

| SW2 | SW1 | A_out | B_out |
|---|---|---|---|
| 0 | 0 | a_in | b_in |
| 0 | 1 | b_in | a_in |
| 1 | 0 | b_in | a_in |
| 1 | 1 | a_in | b_in |

Figure 9D:
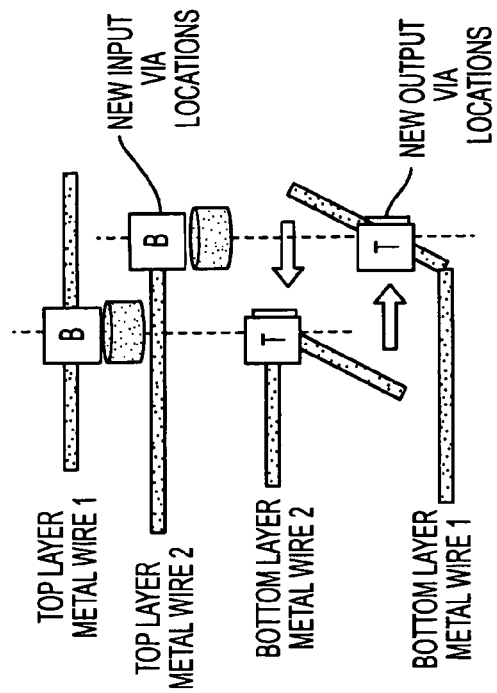
Figure 9C:
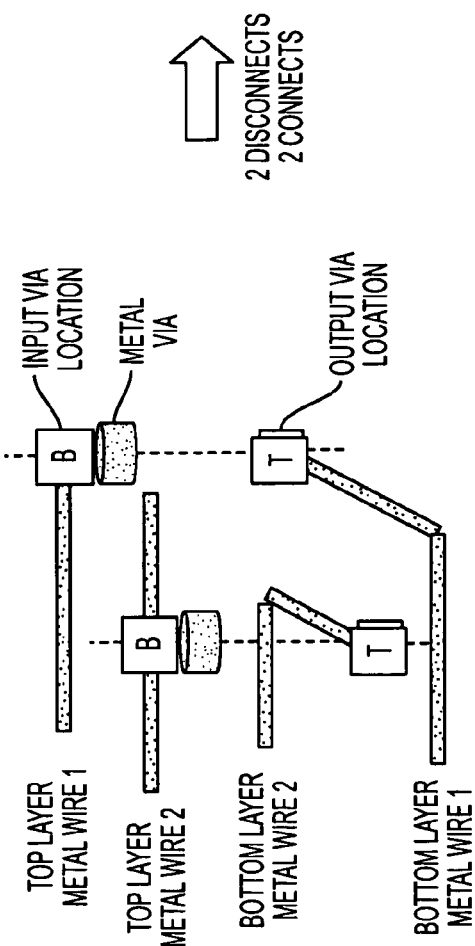

FIGS. 9C and 9D illustrate metal vias inserted between the "b" and "t" via locations to connect the bottom layer metal wires to the top layer metal wires. Via location "b" means bottom input and via location "t" means top output. FIG. 9C shows a connection between the bottom layer metal wire 1 and the top layer metal wire 1. Also, there is a connection between the bottom layer metal wire 2 and the top layer metal wire 2. FIG. 9D shows the result of two metal via disconnection and two metal via connection starting from FIG. 9C. As a result, FIG. 9D shows a connection between the bottom layer metal wire 1 and the top layer metal wire 2. Also, there is a connection between the bottom layer metal wire 2 and the top layer metal wire 1. Hence, the configuration of FIG. 9D effectively emulates the effect of a double-pull double-throw switch that cross connects the metal wires between the bottom and top metal layers, as described above in connection with FIG. 9B.

Figure 10A:
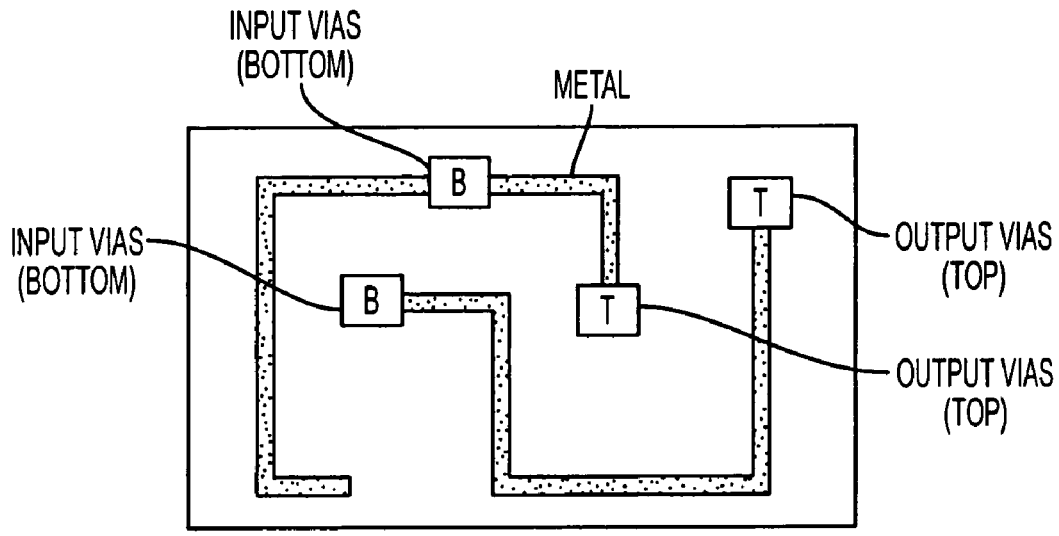
FIGS. 10A and 10B illustrate a basic MMCEL metal and via layer pattern template according the present invention.
Figure 10B:
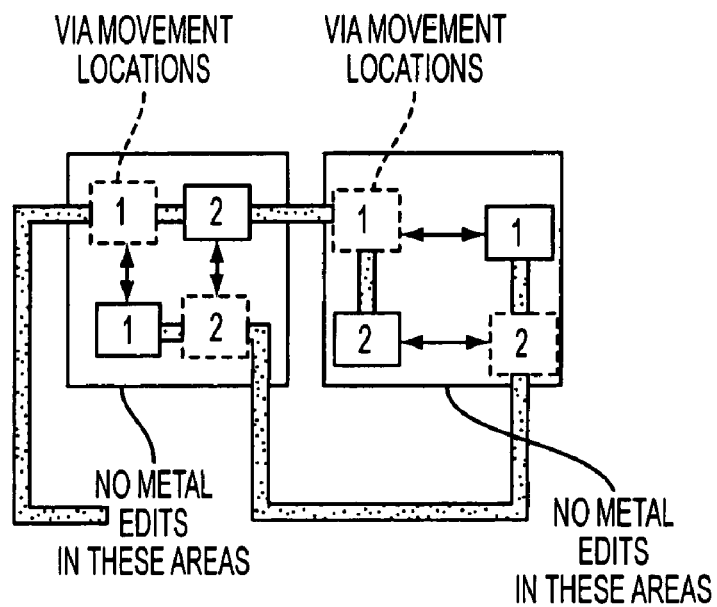

FIGS. 10A and 10B illustrate a basic metal and via layer pattern template according to the present invention. Input vias that connect to a bottom metal layer are labeled "b", while output vias that connect to the top metal layer are labeled "t". Metal traces of the pattern template are shown as solid black lines. The position of bottom vias on a current layer is determined by the position of corresponding top vias on an adjacent bottom metal layer.

Therefore, for single via layer changes, only output vias on the current layer are allowed to be moved and input vias remain fixed. This is illustrated in FIG. 10B.

Space is allocated to make the metal edits (cuts and jumps) and also to remove and place the vias. Layout rules are used, such as "keep-out" sections where the metal edits can be implemented along with specific via placement locations. These layout rules ensure the functional integrity of the MMCEL for future modifications. Two keep-out sections surrounding the input vias and output vias are shown in FIG. 10B.

The two bottom (input) vias on the left keep-out area of FIG. 10B are labeled 1 and 2, respectively. Similarly, the two top (output) vias are also labeled 1 and 2 respectively, on the right keep-out area of FIG. 10B. The darker shaded numbers 1 and 2 on both the left and right portion of FIG. 10B correspond to the initial locations of the input and output vias of FIG. 10A. A via change comprises relocating the via layer pattern from the initial positions to new positions illustrated by the dashed boxes and arrows at FIG. 10B. MMCEL layout edit rules for via changes will be described in more detail below.

In an embodiment of the present invention, the logic state of the MMCEL outputs can be inverted simultaneously by following the MMCEL's own layout design edit rules in altering a metal or via layer. There are basically four metal layer edit rules and four metal via edit rules. These rules ensure that current layout changes inside the MMCEL preserve the functionality and integrity of the MMCEL. Also, the edit rules are designed to allow future changes to the metal structure of the same MMCEL, since revision ID bits or default register values often change more than once.

Hence, the MMCEL has the unlimited capability to be modified by a user in order to invert its output values at any single metal or via layer.

FIGS. 11A–D illustrate MMCEL layout edit rules for metal changes. A basic metal and via layer pattern template is illustrated in FIG. 11A and a flip basic pattern is illustrated in FIG. 11C. The basic pattern of FIG. 11A is used in the odd metal layers (e.g., M1, M3, M5, etc.). The flip basic pattern is used in even metal layers (e.g., M2, M4, M6, etc.). Reversal of these patterns (i.e., basic on even metal layers and flip on odd) is also contemplated.

The MMCEL metal edit rule comprises two cuts and two jumps in order to implement a metal change for either the basic pattern or the flip basic pattern. FIG. 11B shows two cuts 1102 and 1104 and two jumps 1106 and 1108 used to implement a basic pattern metal change. Similarly, FIG. 11D shows two cuts 1110 and 1112, as well as two jumps 1114, 1116, which implement the flip basic pattern metal change.

Figure 12A:
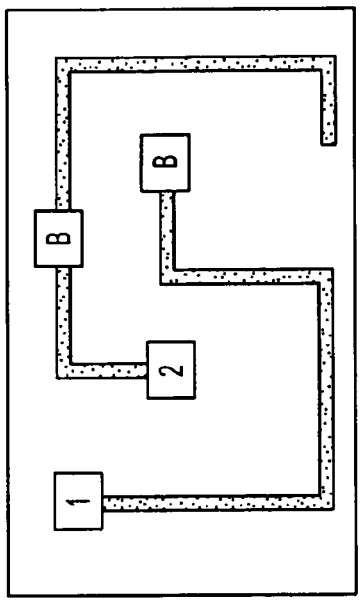
Figure 12C:
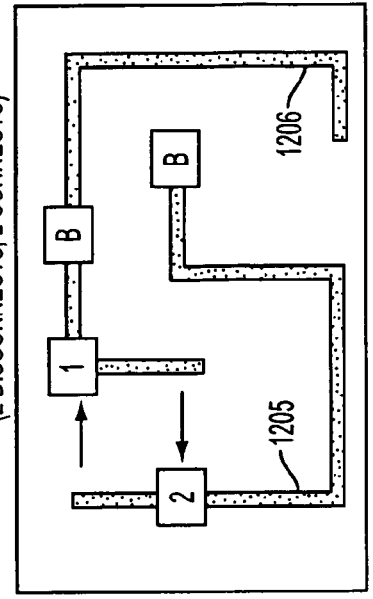
Figure 12B:
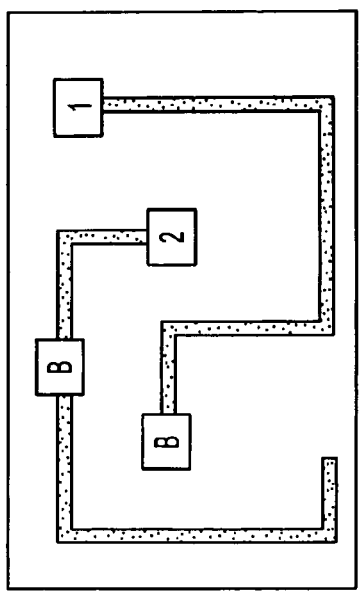
Figure 12D:
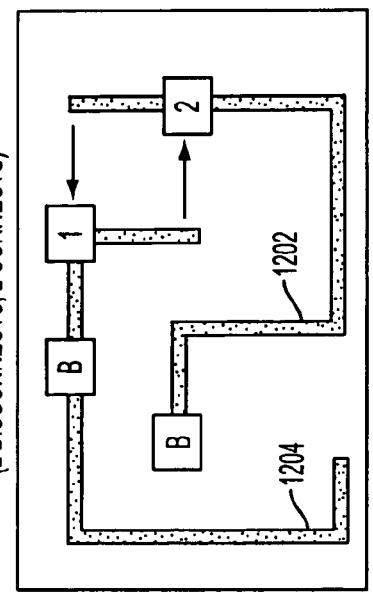

MMCEL via edit rules will now be described in connection with FIGS. 12A–12D. FIGS. 12A and 12B illustrate the basic metal and via layer pattern template. FIGS. 12C and 12D show the flip basic pattern. In order to implement a via edit on the basic pattern, two disconnects and connects of vias are required. A first via (labeled "1") is disconnected from trace 1202 and a connection is made to trace 1204. Additionally, a second via (labeled "2") is disconnected from metal trace 1204 and then connected to trace 1202, as shown in FIG. 12B. The order in which the disconnects and connects are performed is irrelevant. Similarly, a via edit for the flip basic pattern is shown in FIG. 12D. Via 1 is disconnected from trace 1204 and then connected to trace 1206, while via 2 is disconnected from trace 1206 and then connected to trace 1204.

FIG. 13 illustrates MMCEL basic pattern layout permutations. Four patterns are shown, including pattern A, pattern B, pattern C and pattern D.

Beginning with pattern A, a via change according to the above described rules results in what is shown in pattern B. Alternatively, starting at pattern A, a metal change according to the above-described rules results in what is shown at pattern D. Thus, the via disconnects and connects and metal cuts and jumps are illustrated for each metal or via permutation starting with any one of the four patterns. Similarly, FIG. 14 illustrates an MMCEL flip basic pattern layout permutation. Four patterns are shown including pattern E, pattern F, pattern G and pattern H. Again, all via disconnects and connects and metal cuts and jumps required to move from one pattern to another pattern are shown in FIG. 14 for the flip basic pattern.

The vias labeled 1 and 2 in FIGS. 13 and 14 represent the top vias described above in connection with basic patterns. Thus, the vias labeled "b" in FIGS. 13 and 14 are provided at these locations by way of example and not limitation. In other words, in an actual implementation the positioning of the b vias will depend upon the positioning of the vias coupled to a lower metal layer. Therefore, the b vias shown on FIGS. 15A–15D do not correspond specifically to the b vias of FIGS. 13 and 14, because their position is dependent upon the location of each underlying metal layer via, as addressed above in connection with FIGS. 10A & 10B.

FIGS. 15A–15D illustrate a triple metal stack layout example according to the present invention. Basic pattern layouts are shown at the bottom and top of each one of FIGS. 15A–15D that are associated with M1 and M3, respectively. A flip basic pattern is shown in the middle of the stack in each of FIGS. 15A–15D, and corresponds to M2. Each basic or flip pattern layout of FIGS. 15A–15D are also labeled as pattern A through pattern H as described above in connection with FIGS. 13 and 14.

An initial structure of the stack layout example is shown in FIG. 15A.

The basic layout pattern at M1 in FIG. 15A shows a first metal trace tied to ground having a first via labeled "1", and a second metal trace tied to power and coupled to a second via labeled "2". The flip basic pattern E of FIG. 15A has a first metal trace with vias labeled "b" and "2". Via b electrically couples the first metal trace at M2 to the first metal trace of M1 at the same via, as illustrated by vertical lines 1502. Thus, the first metal trace of the flip basic pattern E at M2 is also coupled to ground.

A second metal trace of flip pattern E at M2 is coupled to two vias labeled "1" and "b". As described above, the vias labeled "b" indicate that via is coupled electrically to a bottom metal layer. Thus, the second trace of flip pattern E is electrically coupled to the second metal trace of basic pattern A at M1, and is thus coupled to power.

The right most vias at M2 couple the first and second traces of flip basic pattern E to the metal traces at M1. The two left most vias of flip basic pattern E at M2 couple the M2 traces to the M3 traces stacked thereon. In this arrangement, the via labeled "2" couples the first trace of a flip basic pattern E at M2 to a first metal trace of basic pattern A at M3. This coupling is shown at 1504. The output RevID<0> of this MMCEL is a logic 0 as provided at a top via labeled "1" on the first metal trace of basic pattern A at M3. Although not shown on this figure, a logic 1 is available at the second top via labeled "2" on the second metal trace of basic pattern A at M3.

FIG. 15B illustrates a metal change at the center layer of the stack layout shown in FIG. 15A. The metal change at center layer represents basic pattern H shown in FIG. 14. Based on this change, which includes two cuts and two jumps, the right most via b at the center layer is now electrically coupled via a metal trace to the second top via at the center layer, which in turn is coupled to the first trace at M3. This metal layer change at the center layer causes the RevID<0> to change from a logic 0 to a logic 1. While the signal coupling to the top via labeled "1" at M3 is provided to M2 as in 1504 in FIG. 15A, the operative coupling between M2 and M1 is now provided by the other bottom via of M2 as shown at 1506.

FIG. 15C illustrates a via change at the center layer. Because a via change is at the center layer, the flip basic pattern now corresponds to pattern G of FIG. 14. Thus, via 1 of pattern A at M1 provides a ground signal to M2, which in turn provides ground to M3 at via 2 of flip pattern G. These connections are shown at 1508 and 1510, respectively. Accordingly, the output at M3 via 1 is changed from a logic 1 to a logic 0.

A final revision example is shown in FIG. 15D, which comprises a metal change at the center layer. In this case, via 2 of M1 is used to couple power to M2. Using the flip pattern F, the second via of M2 is used to couple power to M1, as shown at 1512 and 1514, respectively. In this manner via 1 of M3 is switched from logic level 0 to logic level 1.

FIGS. 16, 17A–C, 18A–C, 19A–C, 20A–C and 21A–C illustrate an MMCEL layout in a six metal layer implementation according to the present invention.

This exemplary MMCEL layout is implemented in layer M6 0.13 μm semiconductor manufacturing technology. Other known and future technologies employing metal (e.g., 0.18 μm aluminum, 0.13 μm copper, etc.), doped polysilicon, and the like, can be used as would be apparent to a person having ordinary skill in the art.

Figure 16:
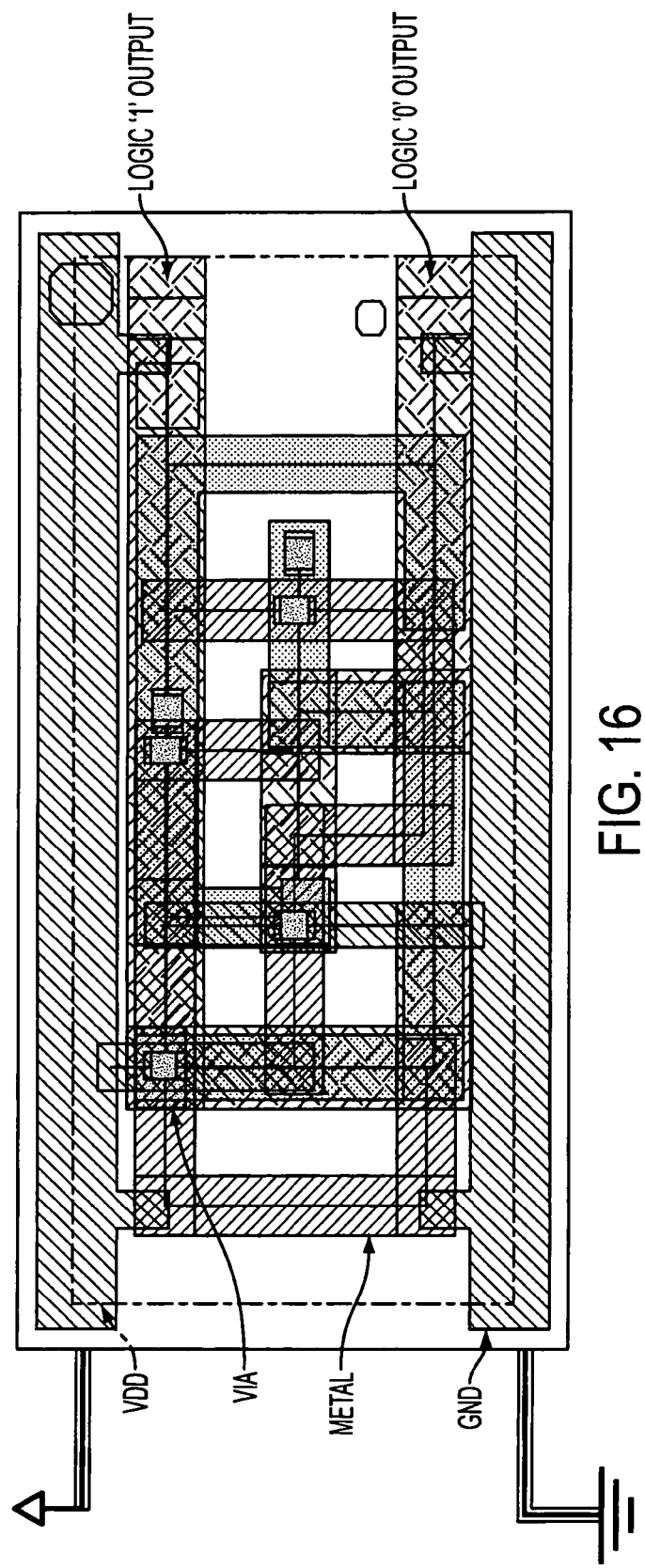
Figure 17B:
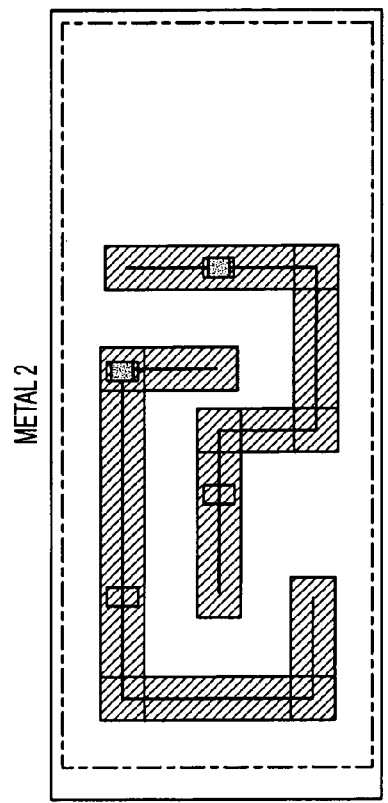
Figure 17A:
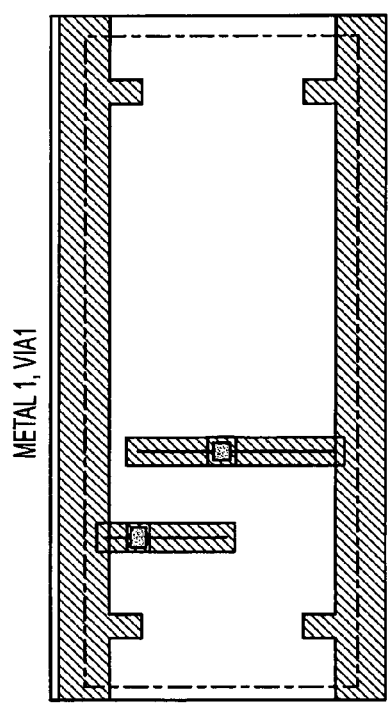
Figure 17C:
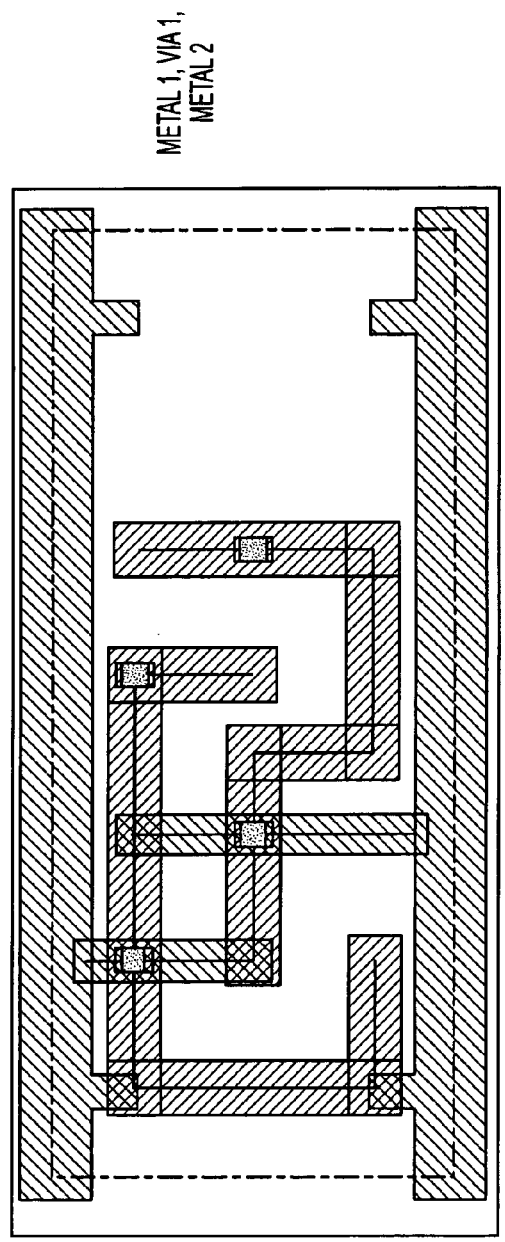
Figure 18B:
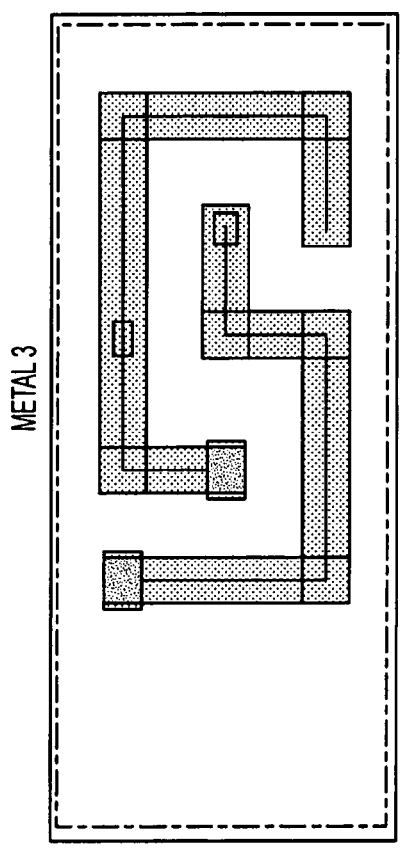
Figure 18A:
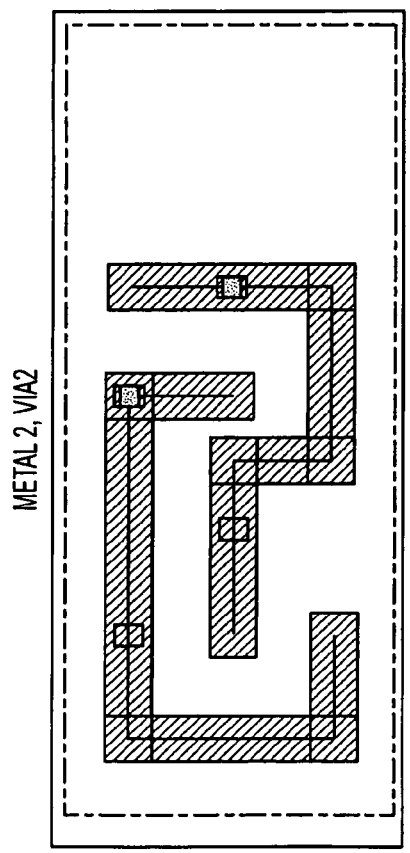
Figure 18C:
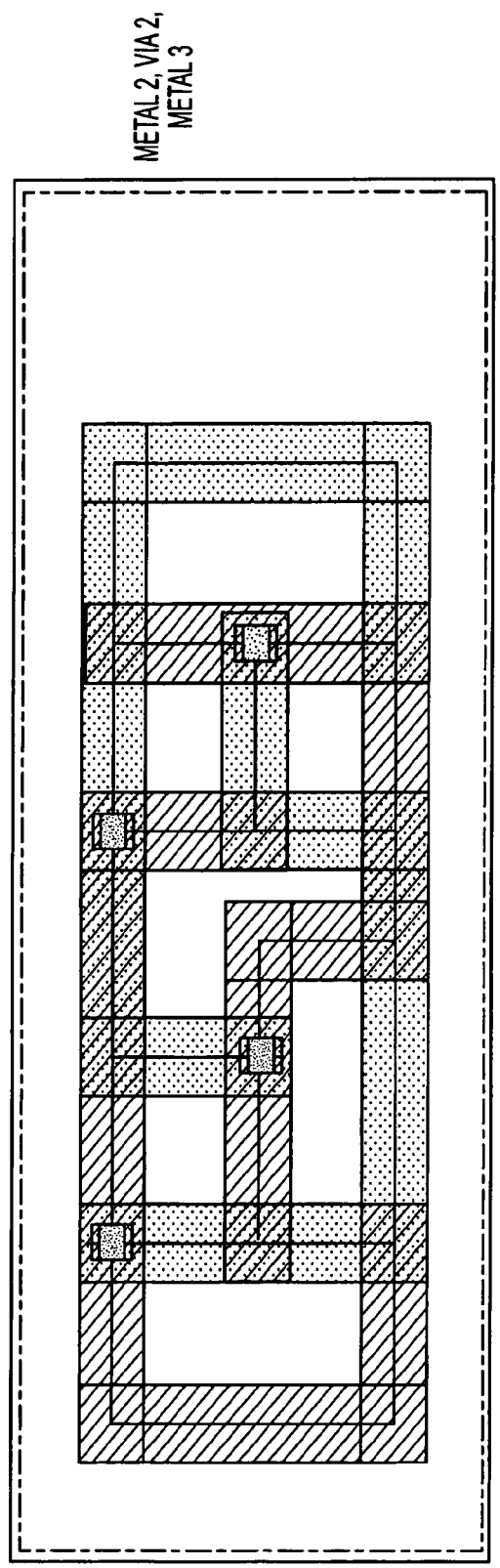
Figure 19A:
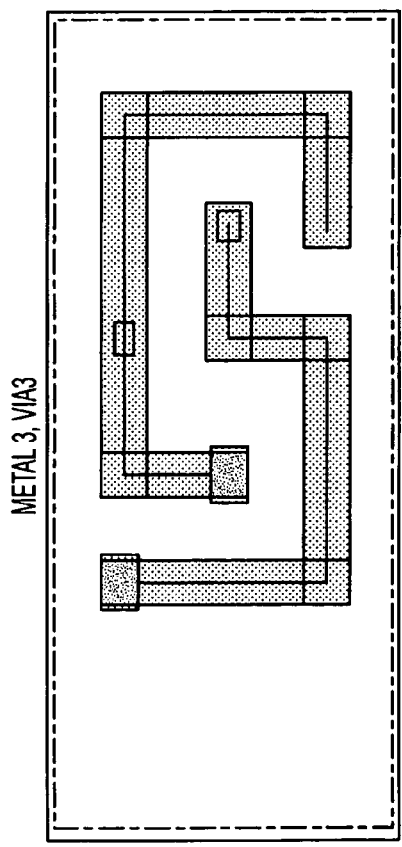
Figure 19B:
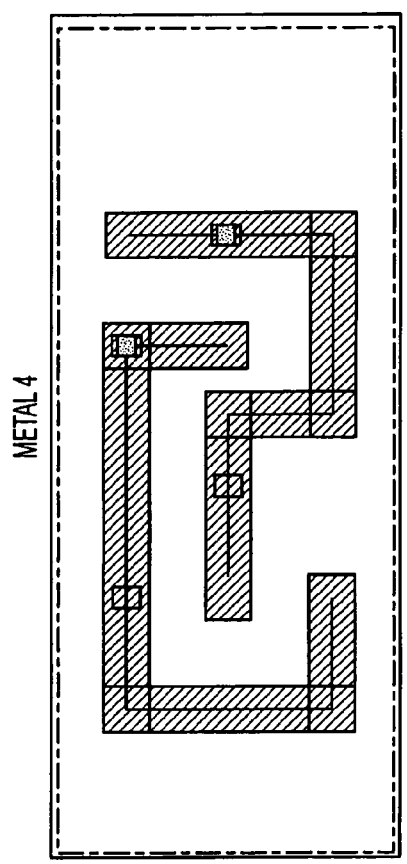
Figure 19C:
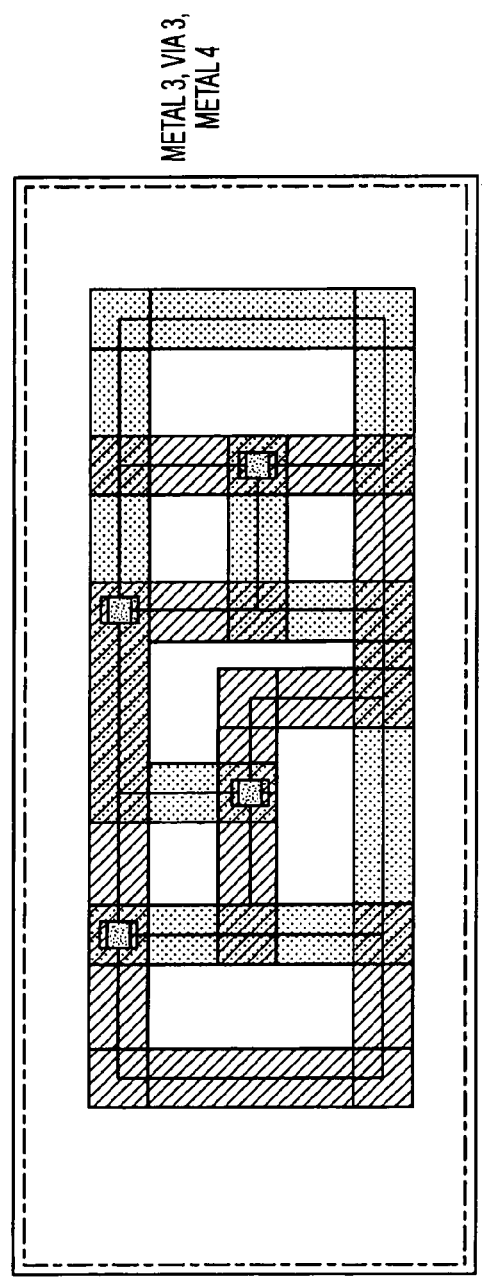
Figure 20B:
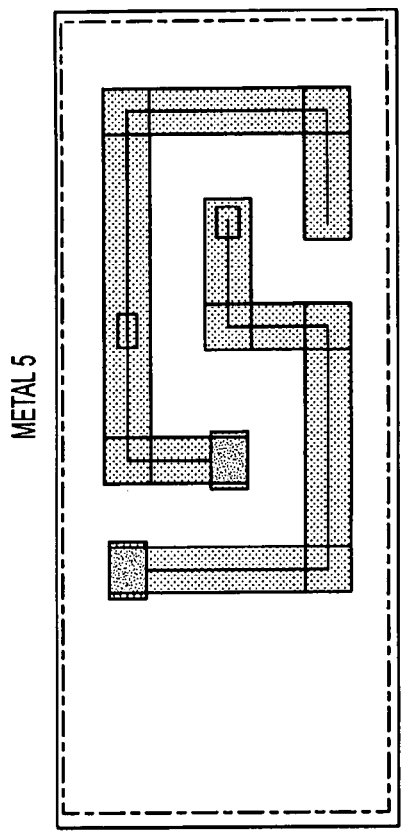
Figure 20A:
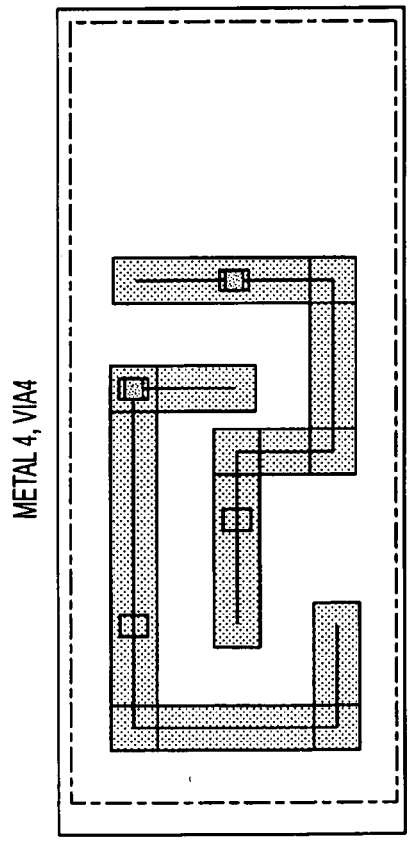
Figure 20C:
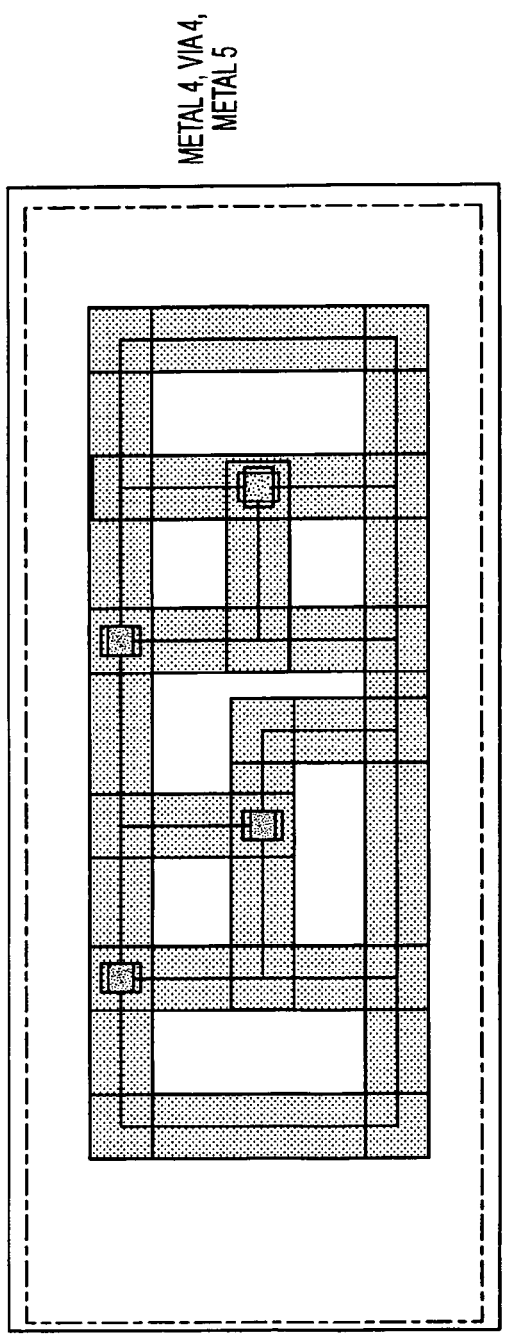
Figure 21B:
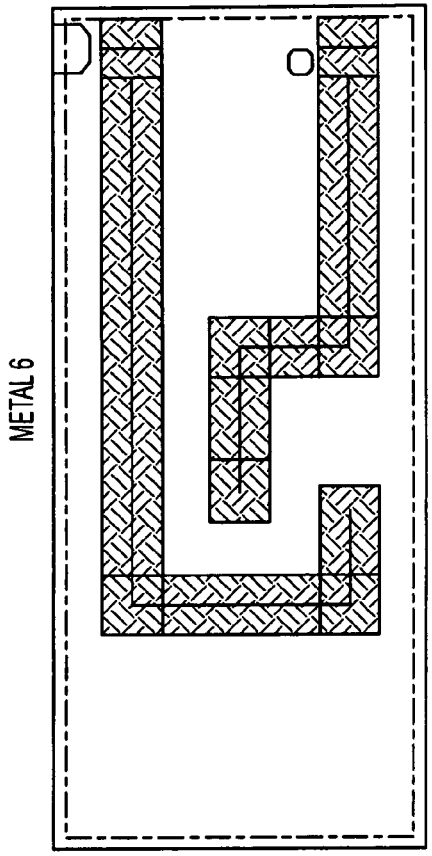
Figure 21A:
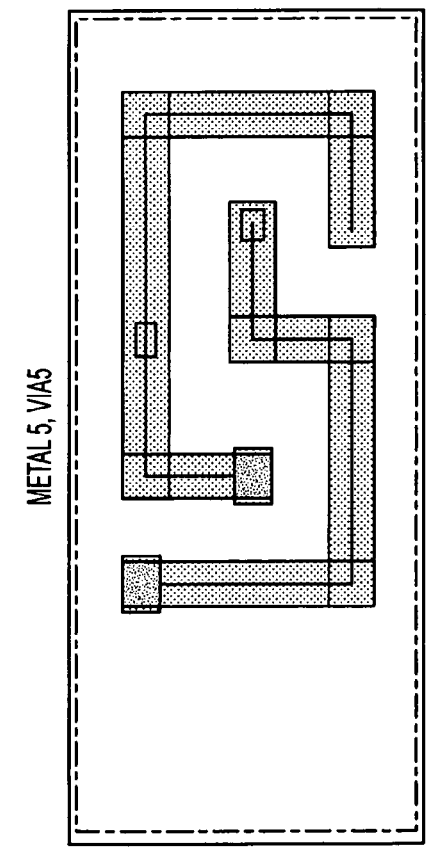
Figure 21C:
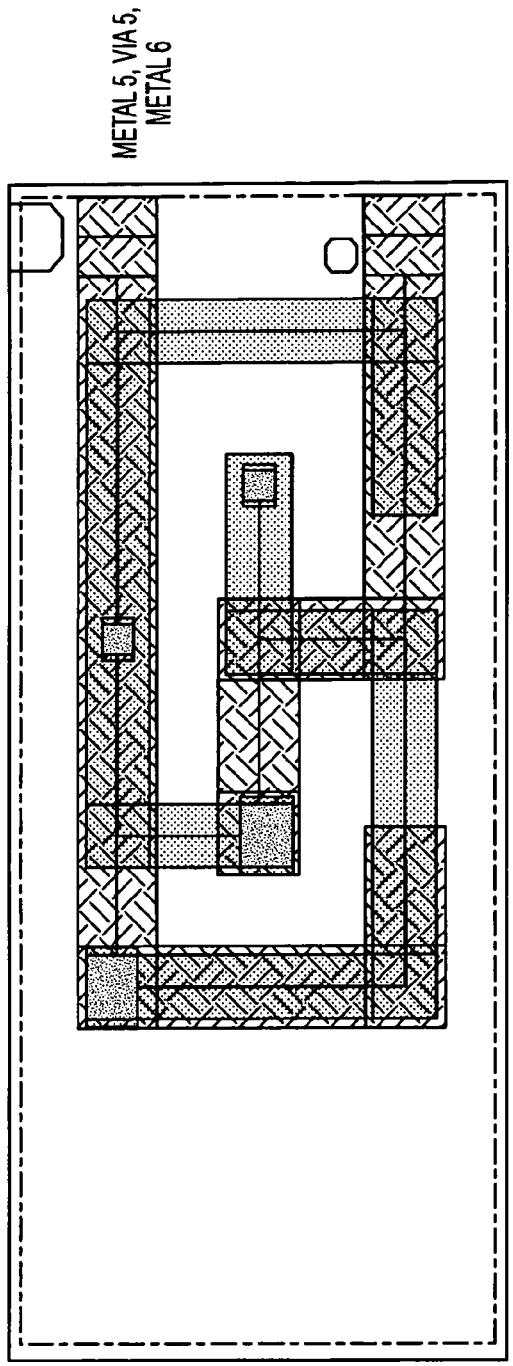

FIG. 16 shows all layers of the stacked structure. FIG. 17A shows M1 and via layer 1. FIG. 17B shows M2. FIG. 17C shows an overlay of M1, via 1 and M2 layers. FIGS. 18–21 show the remaining metal and via layers of the stacked structure. The dimensions shown in the figure are presented for illustration, and are intended to being limiting.

Layout blocks implemented with conventional "standard cells" have rows of same-height cells that abut as much as possible. Any gaps between the cells are typically filled with "filler" cells. These filler cells contain geometries to extend certain layers across the gaps, such as power straps and well implant. The gaps between the "standard cells" are caused by the inefficiency of the routing tool used by the layout designer. In order to comply with Design Rule Check (DRC) requirements, these gaps must be filled with the same basic material used in the "standard cells" in order to preserve the power supply and base layer connections. The chip will not function correctly if the filler cells are not inserted between the gaps.

One implementation of the MMCEL or MCCEL is a design that starts with a filler cell that has the same layout structure and size as a "Filler_16" cell so that all base layers will match. The only modifications the inventors needed to make were changes to the metal and via layers. For existing designs, the MMCEL or MCCEL becomes drop-in compatible for all metal layer changes. This enables the designers to instantiate a new MMCEL or MCCEL even after the base layers have been fabricated. The main advantages of using "Filler_16" are availability of existing "standard cells", drop-in capability, and no electrical impact to existing design.

Using the "standard cell" approach, an MMCEL layout in accordance with an embodiment of the present invention can meet the requirements for focused ion beam (FIB) anisotropic etching to implement edits. Ample space may be provided between the MMCEL's metal interconnect on the top metal layer so that a cut and a jump can be successfully implemented without creating a short. The FIB area can be located at the highest metal layer where it is readily accessible.

FIG. 22 illustrates the use of FIB technology for programming the MMCEL of the present invention. A FIB free space region is shown generally at 2202. Two parallel metal strips (traces) are shown generally at 2204. A cut of a metal trace is illustrated generally at 2206. A jump between two metal traces is shown at 2208. Metal "cuts" require more free space than metal deposition. Distance between parallel metal strips is dictated by design rules.

The meta-memory cells of the present invention can be implemented as a library cell for ease of use among chip projects. 16, 8, 4, 2, 1 and ½ cycle cells can be used, for example. As is described above, each cell type has a pre-programmed output such as logic 1 or logic 0. Alternatively, cells that are not preprogrammed can be used, which are referred to herein as meta-connect cells (MCCEL). These MCCEL type cells are used to interconnect adjacent blocks of logic of an integrated circuit design and allow interconnect changes within any given metal interconnect layer of the integrated circuit. Data, control and/or radio frequency (RF) signals can be passed between adjacent logic blocks using the MCCEL according to the present invention.

FIG. 23 illustrates the general use of MCCELs according to the present invention. On an integrated circuit 2300, a first logic design block 2302 has neighboring logic design blocks 2304 and 2306, for example. MCCELs 2308 are used to interconnect logic design blocks 2304 and 2306 to block 2302. Additional logic design blocks located adjacent to logic design block 2302 can also be coupled thereto by additional MCCELs. Each MCCEL comprises any of the ladder structures described above. However, the ladder structures that form each MCCEL do are not coupled at M1 to power or ground, but provide electrical connectivity between one or more adjacent logic design blocks. An advantage of this arrangement is that connections between adjacent logic design blocks can be modified during chip revisions at any metal or via layer, as described above in connection with the various MMCEL embodiments. Also, because of the complexity to today's integrated circuits, various logic design blocks are often developed by different design team within a company. According to this embodiment of the present invention, a standard approach is provided for connectivity between independently developed logic design blocks that are eventually laid-out adjacent to one another on an integrated circuit chip. A further benefit is yielded as design teams change from revision to revision, since the standard approach for connecting adjacent logic design blocks remains the same.

Figures 24A, 24B:
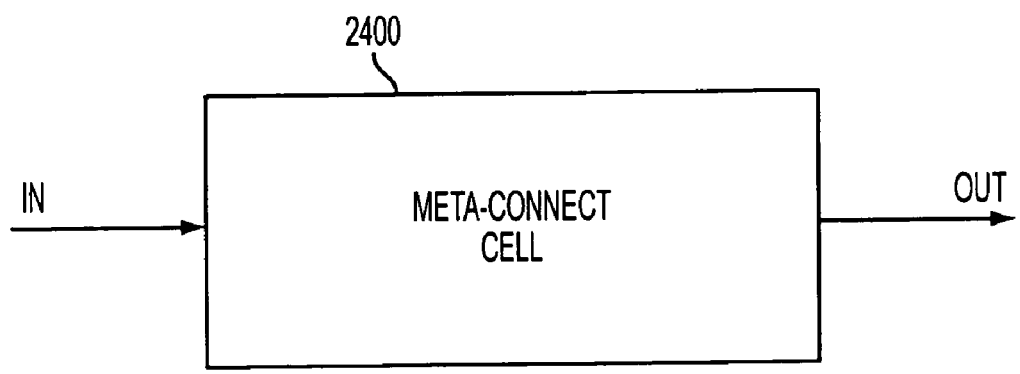

A block diagram of a single-line MCCEL 2400 is illustrated in FIG. 24A. A logic table corresponding to MCCEL 2400 is illustrated in FIG. 24B. MCCEL 2400 has a small footprint and accommodates a single layer metal change, according to the present invention. The MCCEL 2400 can undergo a limited number of metal changes as dictated by number of ladder "cycles" in a cell. The MCCEL 2400 has a single input and a single output, which can be tied to a logic '1', logic '0', or can be used as a connection to any metal layer as shown in the logic table of FIG. 24B. The MCCEL 2400 can be FIB'ed, buffered to reduce problems with long routes or heavy loads, and works with existing or new chip designs.

The MCCEL 2400 has the same basic architecture and layout as the single ladder MMCEL, but replaces the GND connection with an input "In" in the beginning of the ladder structure. This input "In" can be connected at any subsequent layer that is not yet utilized. The MCCEL 2400 can connect wires between logic blocks or can be used to break an existing connection to make a new one. Although the port names (i.e., the input and output) are uni-directional, the MCCEL 2400 is really bi-directional because it consists only of metal wires and metal vias. Thus, the electrical signal can readily propagate in both directions whether it is a pulse, static, or radio frequency (RF) signal.

Figure 25:
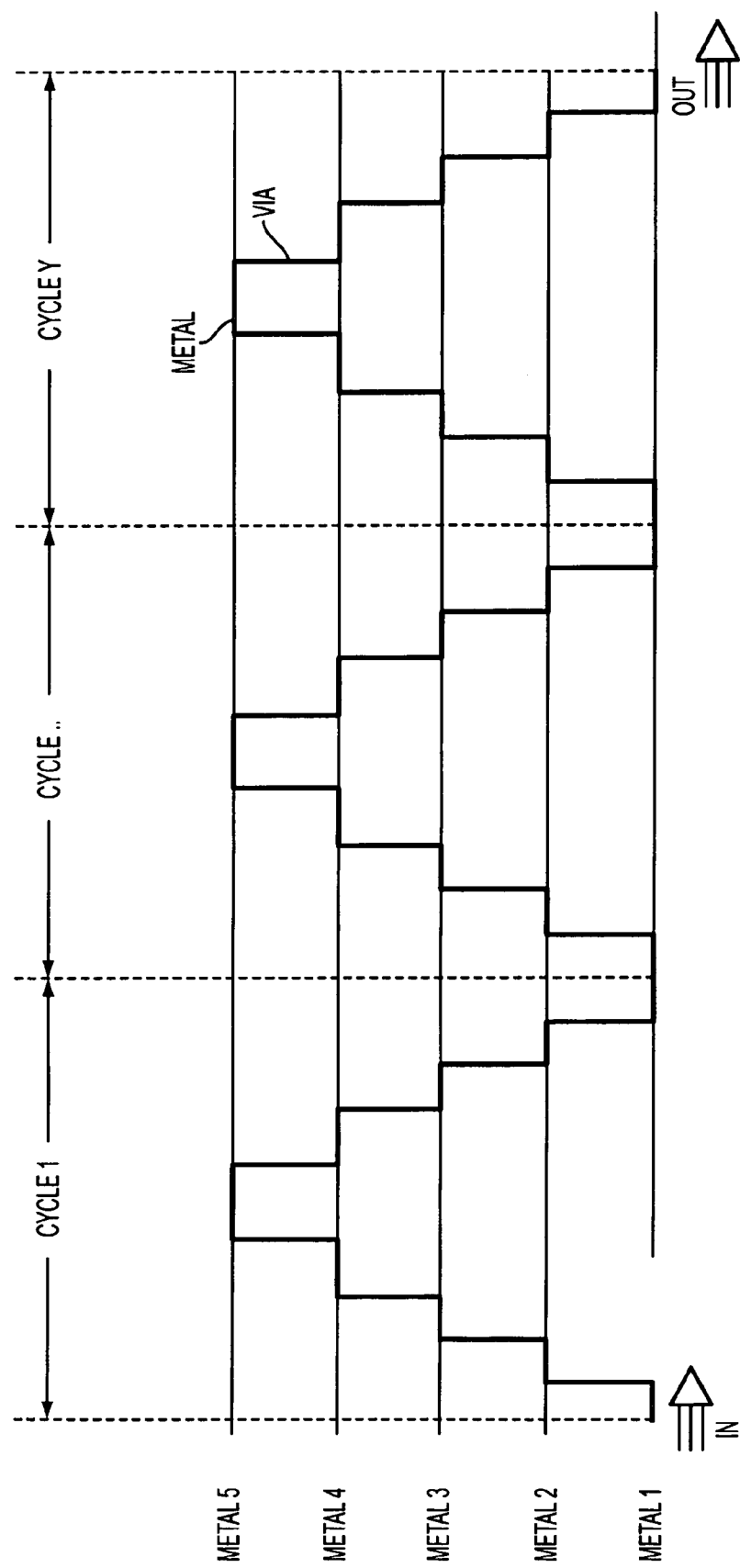

An exemplary layout for a single-ladder MCCEL 2400 is illustrated in FIG. 25. An Input "In" is initially tied at Metal 1. Thereafter, other external sources can be connected to input "In" at any subsequent available metal layer. The MCCEL 2400 shares the same architecture and layout as the single ladder MMCEL described above (e.g., FIG. 3A), except for the initial GND connection in the beginning of the metal ladder.

Exemplary applications of the single-line MCCEL 2400 are illustrated in FIGS. 26A–26D.

FIG. 26A shows a default metal wire interconnection between a logic block 1 and a logic block 2 using two MCCELs. FIG. 26B shows a pull-up to VDD connection of logic block 2 using one MCCEL. The input to logic block 2 is now logic '1'. FIG. 26C shows a pull-down to GND connection of logic block 2 using one MCCEL. The input to logic block 2 is now logic '0'. FIG. 26D shows a new connection from another logic block to logic block 2 using one MCCEL. Logic block 2 is no longer connected to logic block 1.

The single-ladder version of single-line MCCEL has limited changes based on number of ladder "cycles" in the cell, as described above in connection with the single line-line MMCEL (e.g., FIGS. 2–3C).

Figures 27A, 27B:
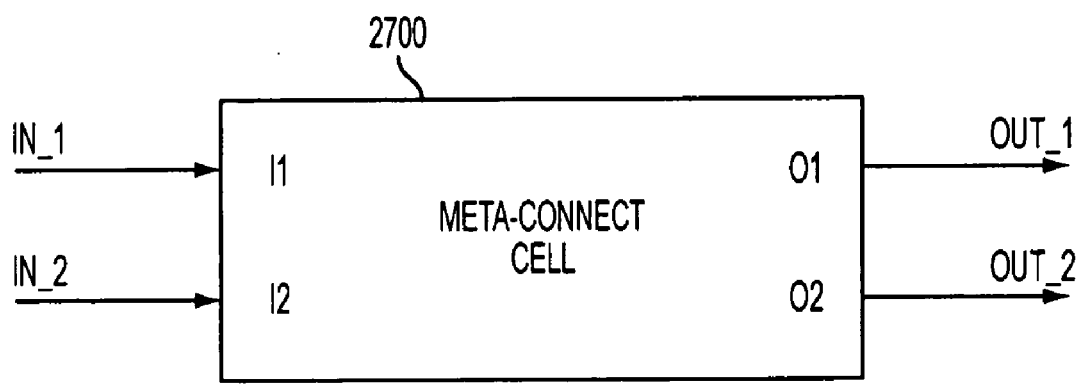

A dual-line MCCEL 2700 is illustrated in FIG. 27A. A logic table corresponding to the dual-line MCCEL 2700 is illustrated in FIG. 27B. The dual-line MCCEL 2700 accommodates both single layer metal or single layer "via" changes, and an infinite number of changes on any single metal or "via" layer can be made per cell. Dual inputs terminals (I1 and I2) and dual outputs terminals (O1 and O2) are provided in each cell, with cross connect capability (i.e., the DPDT switch analogy described above applies). The dual-line MCCEL 2700 can be FIB'ed, it can be buffered to reduce problems with long routes or heavy loads, and it can be laid-out to fit within a standard cell library formats, as would become apparent to persons skilled in the relevant art. The dual-line MCCEL 2700 can be placed anywhere on the chip and works with existing or new chip designs. The dual-line MCCEL 2700 can be implemented using the same architecture and layout as the MMCEL described above, except VDD and GND are replaced with dual inputs.

Exemplary applications built with the dual-line MCCELs 2700, can include a: programmable DPDT logic switch; logic inverter; flip-flop output inverter; flip-flop set/clear selector; wired connector; universal I/O pad w/pull-up, pull-down, or no resistor options. Moreover, the MCCEL 2700 can be combined with the MMCEL to produce programmable unique logic functions, such as a universal I/O interface for logic blocks. MCCELs 2700 can be used for analog applications as well as digital applications. These examples are presented by way of example, not limitation.

Although the port names are uni-directional, the MCCEL 2700 is really bi-directional because it consists only of metal wires and metal vias. The electrical signal can readily propagate in both directions (whether propagating a pulse, static, or radio frequency (RF) signal). The default state of the MCCEL 2700 is entered whenever the number of Metal/Via changes becomes even.

Figure 28:
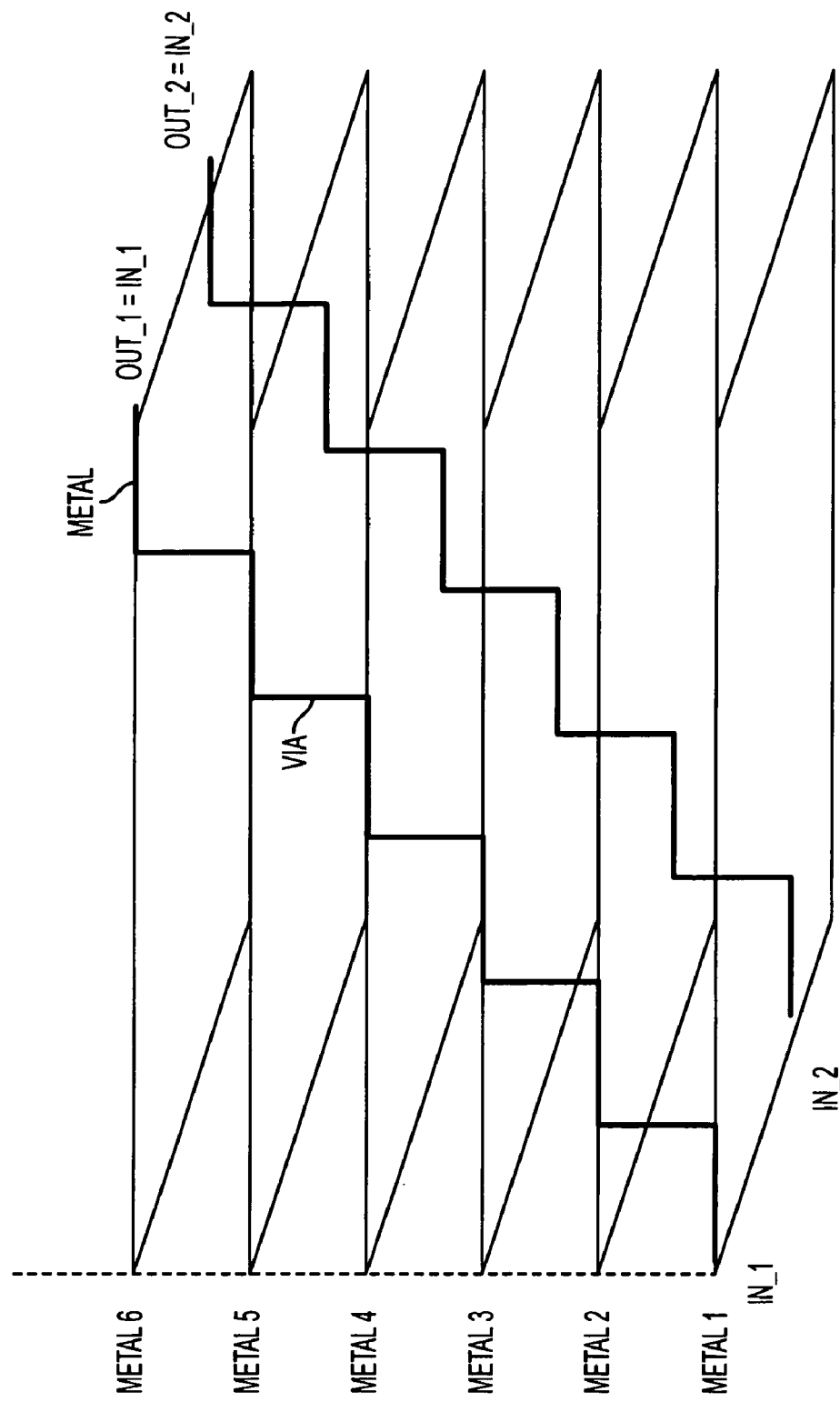

An exemplary default dual-line MCCEL 2700 is illustrated in FIG. 28. This layout comprises two metal ladders. Input signals In_1 and In_2 are tied at M1 of the metal ladder. Both ends of the metal ladder become the output signals of MCCEL 2700, such as Out_1 and Out_2. This layout structure is similar to the dual ladder MMCEL described above, except for the dual inputs.

Figure 29:
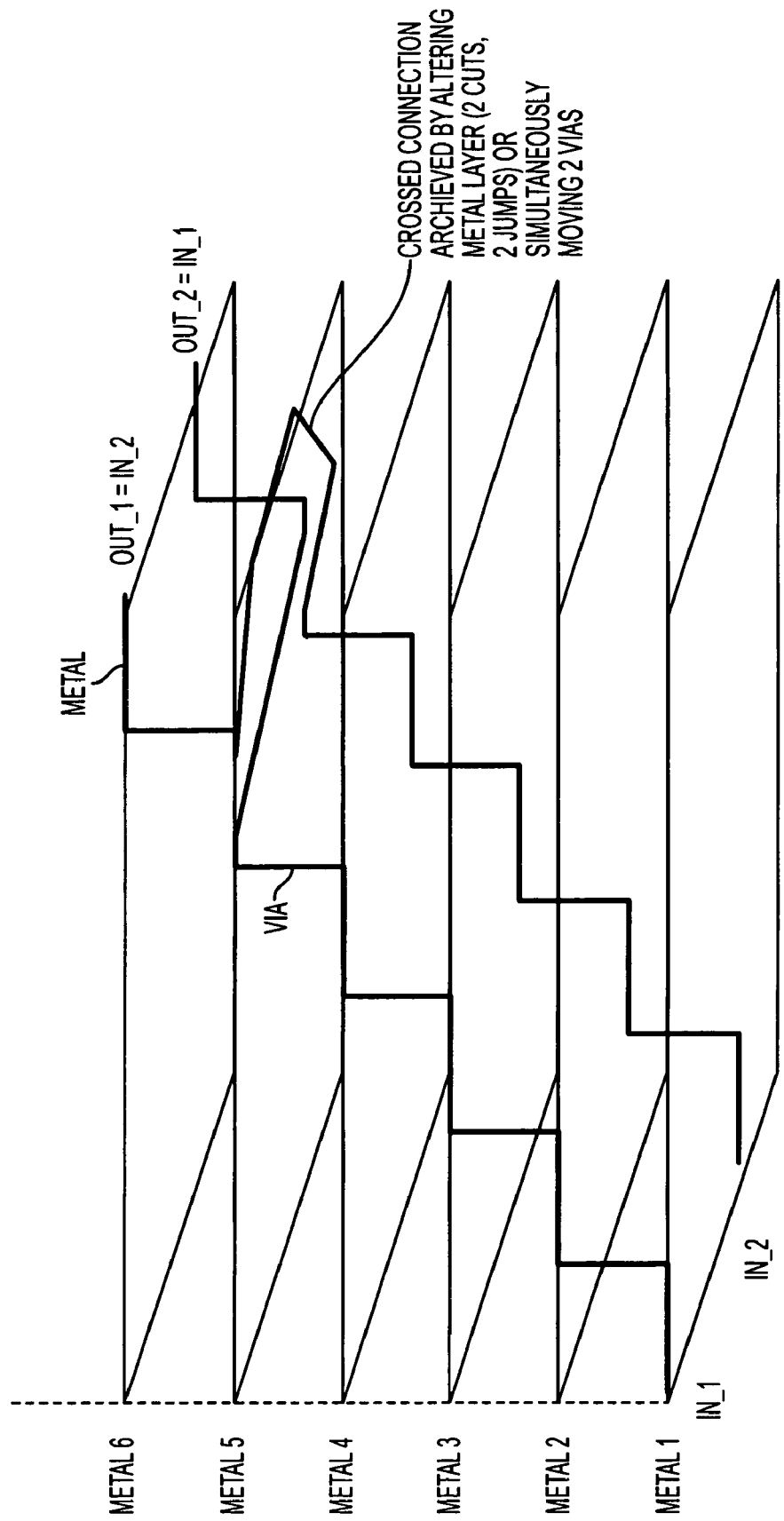

FIG. 29 illustrates a layout change on M5, as compared to M5 in FIG. 28, which is implemented using two cuts and two jumps.

The MCCEL 2700 can be combined with normal logic cells (e.g., inverters, nor, nand, flip-flops, etc.) to create programmable logic whose function can be modified by changing a single metal or via layer.

A dual-line MCCEL 2700 configured as a DPDT logic switch is illustrated in FIGS. 30A–30D.

FIG. 30A shows a programmable inverter 3002 having a MCCEL, which can invert the outputs of a logic function. A logic table corresponding to the programmable inverter 3002 is illustrated in FIG. 30B.

FIG. 30C shows a programmable flip-flop inverter 3004 having a MCCEL, which can swap the outputs of a flip flop without the need for an additional logic inverter. A logic table corresponding to the programmable flip-flop inverter 3004 is illustrated in FIG. 30D.

MCCELs can be embedded inside a logic gate of a library component to provide additional functionality as noted above. The MCCEL is well suited for specialized spare logic library cells called "spare cells".

An MCCEL can be configured to achieve the equivalent functionality to an MMCEL, as illustrated in FIG. 31A. A logic table corresponding to the MCCEL-MMCEL equivalent is illustrated in FIG. 31B. MCCEL 'I2' and 'I1' pins are tied directly to 'VDD' and 'GND', respectively, to emulate the same functionality of a MMCEL. However, the configuration shown in FIG. 31A is slightly larger than an MMCEL due to additional routing of the 'VDD' and GND' signals. Thus, it is recommend to use MMCEL if this type of functionality is required.

FIG. 31C shows an equivalent circuit to FIG. 31A. Series resistors (resistor) are placed between the 'VDD' or 'GND' and the I1 and I2 pins of the MCCEL to enable a weak pull-up or a weak pull-down. The weak pull-up or weak pull-down enables the MCCEL output pins 'O2' or 'O1' to be driven to a logic '1' or logic '0' if the signals 'In_2' and 'In_1' are not electrically driven (e.g., they are "floating"). If 'In_2' or 'In_1' are electrically driven, then the MCCEL will function according to its original design. The value of the weak pull-up or weak pull-down resistor is designed so that it does not interfere with the normal electrical function of the MCCEL. A buffer in series can be used to help drive high output fanouts. A logic table corresponding to the MCCEL-MMCEL equivalent in FIG. 31C is illustrated in FIG. 31D.

In one embodiment, MCCELs can be combined to perform unique logic functions such as the Programmable Flip-Flop Clear/Set Control logic (i.e., configured to control default register values), as shown on FIG. 32A. Two dual-line MCCELs (MCCEL1 and MCCEL2) are used to multiplex the appropriate 'reset' signal to either 'CLR' or 'SET' pins of a flip/flop. The MCCELs are connected in parallel.

If the 'RESET' signal is active low, then both 'Out1_2' and 'Out2_1' signals should be active low as well, and the 'GND' inputs to I1 of MCCEL1 and I2 of MCCEL2 should be tied to 'VDD'.

If 'RESET' is low, then 'Out2_1' and 'Out1_2' will be low because all inputs of the MCCELs are all low. The flip-flop should function normally based on its logic inputs.

If 'RESET' is high and both MCCELs are in its default state, then 'Out2_1' will be low and 'Out1_2' will be high. The 'CLR' pin will be high and the 'SET' pin will low. The flip-flop output gets cleared as shown on the Logic Table. The default state of the MCCELs is '0'.

If 'RESET' is high and both MCCELs are programmed to cross-connect, then 'Out2_1' will be high and 'Out1_2' will be low. The 'CLR' pin will be low and the 'SET' pin will high.

The flip-flop output is set as shown in FIG. 32B. MCCELs must be programmed at the same time, otherwise, the flip-flop will go into an indeterminate state because the 'CLR' and 'SET' inputs could both be high. The toggle state of the two MCCELs cannot be both a '1' and a '0'. MCCEL logic as shown in FIG. 32A performs its function without the need for any inverters or other logic gates. It is an all metal layer only solution which does not require any active silicon.

In another embodiment, MCCELs can also be combined to perform unique logic functions such as the Programmable Wire Connector logic shown in FIG. 33A. In FIG. 33A the MCCELs are connected in series. A logic table corresponding to FIG. 33A is illustrated in FIG. 33B. Two dual-line MCCELs are used to multiplex the appropriate pull-up resistor or pull-down resistor onto a wire carrying signal 'In2_2', which allows the wire carrying signal 'In2_2' to be effectively disconnected or connected from a wire carrying signal 'In2_1'. A feedback wire carrying signal 'Out2_2' enables the wire carrying signal 'In2_1' to remain connected to 'O2' of MCCEL2 after a metal or via change on MCCEL2.

If both MCCELs are in its default state, then 'Out2_1' will be coupled only to the wire carrying signal 'In2_1' as shown in FIG. 33A.

If MCCEL2 is programmed to cross-connect and MCCEL1 remains in its default condition, then 'Out2_1' will be coupled to the wires carrying signals 'In2_1' and 'In2_2' and a pull-down resistor.

If all of the wires carrying signals 'In2_2', 'In2_1', and 'Out2_1' are not driven but are kept floating, the state of all three wires will be a logic low because of the weak pull-down resistor.

If both MCCEL2 and MCCEL1 are programmed to cross-connect, then 'Out2_1' will be connected to the wires carrying signals 'In2_1' and 'In2_2' and a pull-up resistor.

If all of the wires carrying signals 'In2_2', 'In2_1', and 'Out2_1' are not driven but are kept floating, the state of all three wires will be a logic high because of the weak pull-up resistor.

The value of the weak pull-up or weak pull-down resistor is designed so that it does not interfere with the normal electrical function of the wired connections. MCCEL1 is used to prevent floating nets. MMCEL1 is optional for the case where the wire carrying signal 'In2_2' is driven by the outputs of a logic cell. The MCCEL circuit of FIG. 33A performs the logic functions shown in FIG. 33B without the need for any inverters or other logic gates. It is an all metal layer only solution which does not require any active silicon.

Figures 34A, 34B:
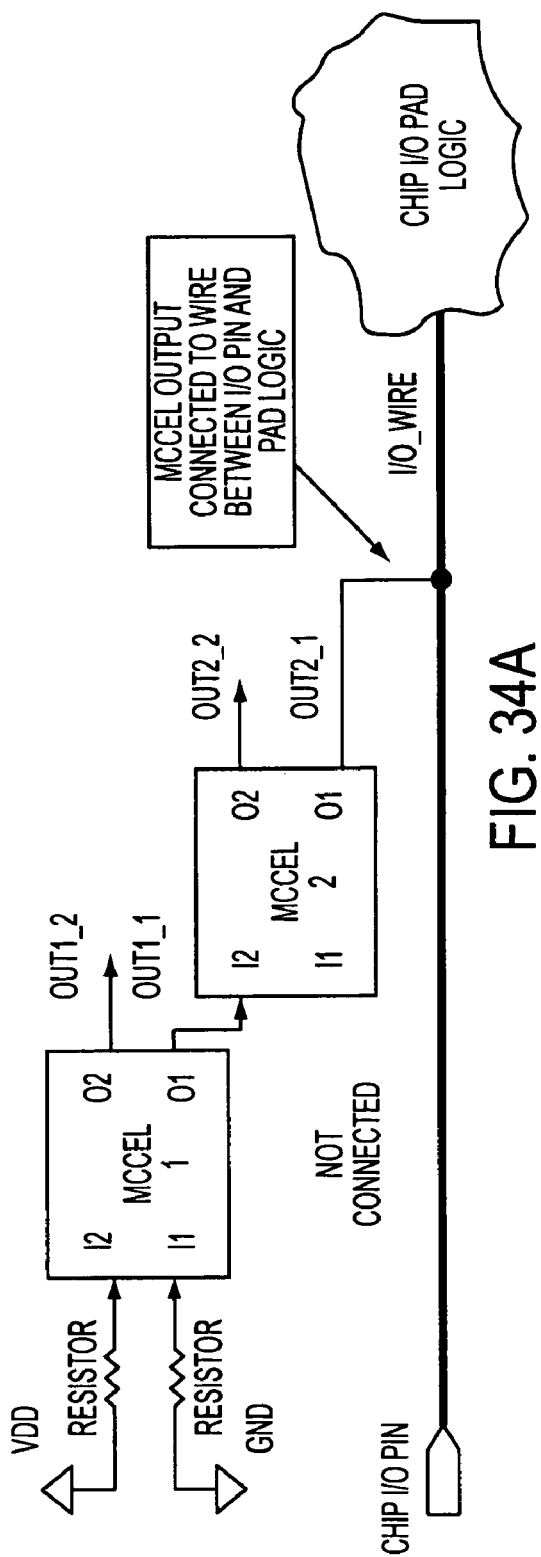

In a still further embodiment, MCCELs can be combined to perform unique logic functions such as the Programmable I/O Pad Control logic shown in FIG. 34A. A logic table corresponding to FIG. 34A is illustrated in FIG. 34B. In FIG. 34A, the MCCELs are connected in series. Two dual-line MCCELs are used to multiplex the appropriate pull-up resistor, pull-down resistor, or no-resistor wire into the I/O pin's 'i/o_wire' that runs between the I/O pin and the I/O pad logic.

If both MCCELs are in its default state, then 'Out2_1' will be coupled to an open wire. The state of the 'i/o_wire' will follow the electrical signal that is driven on the I/O pin as shown on in FIG. 34B.

If the I/O pin is not driven but is kept floating, the state of the 'i/o_wire' will be indeterminate.

If MCCEL2 is programmed to cross-connect and MCCEL1 remains in its default condition, then 'Out2_1' will be coupled to a pull-down resistor. The state of the 'i/o_wire' will follow the electrical signal that is driven on the I/O pin. However, if the I/O pin is not driven but is kept floating, the state of the 'i/o_wire' will be a logic low because of the weak pull-down resistor.

If both MCCEL2 and MCCEL1 are programmed to cross-connect, then 'Out2_1' will be coupled to a pull-up resistor. The state of the 'i/o_wire' will follow the electrical signal that is driven on the I/O pin. However, if the I/O pin is not driven but is kept floating, the state of the 'i/o_wire' will be a logic high because of the weak pull-up resistor.

The value of the weak pull-up or weak pull-down resistor is designed so that it does not interfere with the normal electrical function of the I/O pad.

Above MCCEL logic as shown in FIG. 34A performs its function without the need for any inverters or other logic gates. It is an all metal layer only solution which does not require any active silicon.

Figure 35:
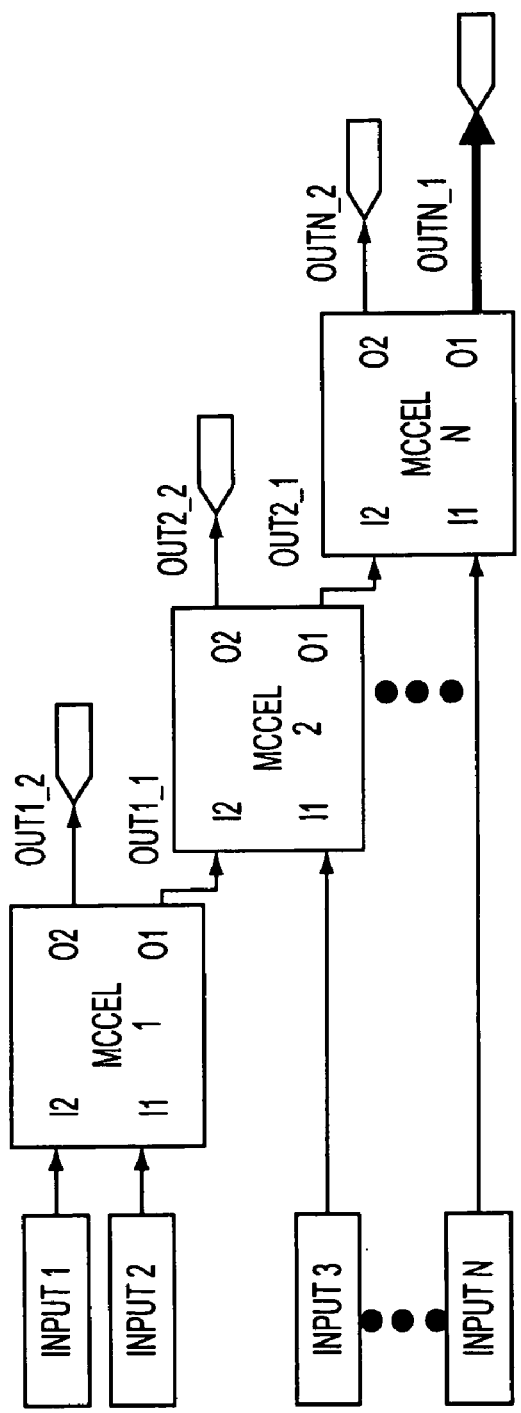

In a still further embodiment, MCCELs can be combined to perform unique logic functions such as the Multi-Inputs Programmable Bi-Directional Multiplexer logic as shown in FIG. 35. In FIG. 35, the MCCELs are connected in series. Multiple dual-line MCCELs are used to multiplex the appropriate inputs (Input 1 to N) to the outputs of the MCCEL output array. The smallest unit of this multiplex structure is basically a single MCCEL such as MCCEL1. This configuration is useful for selecting an output from a group of functional blocks to be driven as outputs of a MCCEL (Out1 to OutN). All inputs can reach an output pin of an MCCEL, but it depends on the programmed state of the MCCEL (crossed or uncrossed). The multiplexer logic structure is non-blocking. There is no limitation on the type of electrical inputs to the MCCEL since its structure is basically a wire. The MCCEL logic performs its function without the need for any inverters or other logic gates. It is an all metal layer only solution which does not require any active silicon.

In a still further embodiment, MCCELs can be combined with MMCELs to perform unique logic functions such as the Programmable I/O Interface Control logic for interconnecting EP blocks as shown in FIG. 36A. A logic table corresponding to FIG. 36A is illustrated in FIG. 36B. The choices of interconnect for each input/output wire are logic '1', logic '0', or pass through connection. An MCCEL and an MMCEL are used to multiplex the appropriate 'VDD', 'GND', or 'In2_1' signals to 'Out2_1' and 'Out2_2'. The MMCEL is used to create the 'VDD' or 'GND' connection and the MCCEL is used to make the pass through connection to 'In2_1'. The MMCEL can be replaced by another MCCEL whose inputs are tied to series resistors instead of a direct connection to 'VDD' and 'GND'. This will prevent contention on the wire when the signals 'Out2_2' or 'Out2_1' are connected directly to an output pin on the logic block. This configuration with the MMCEL work when 'Out2_2' or 'Out2_1' are connected to input pins on the logic block. The two outputs 'Out2_1' and 'Out2_2' yield identical output conditions except for their starting default values. The appropriate output can be selected based on the desired starting default value as shown the logic table of FIG. 36B.

If MCCEL1 and MMCEL1 are in its default state, then 'Out2_1' will be coupled 'In2_1' and 'Out2_2' will be connected to logic '0'.

If MCCEL1 is programmed to cross-connect and MMCEL1 remains in its default condition, then 'Out2_1' will be coupled to logic '0' and 'Out2_2' will be coupled to 'In2_1'.

If MMCEL1 is programmed to cross-connect and MCCEL1 remains in its default condition, then 'Out2_1' will be coupled to 'In2_1' and 'Out2_2' will be coupled to a logic '0'.

If both MCCEL1 and MMCEL1 are programmed to cross-connect, then 'Out2_1' will be connected to a logic '1' and 'Out2_2' will be connected to a 'In2_1'.

The MCCEL logic shown in FIG. 36A performs its function without the need for any inverters or other logic gates. It is an all metal layer only solution that does not require any active silicon.

Figures 37A, 37B:
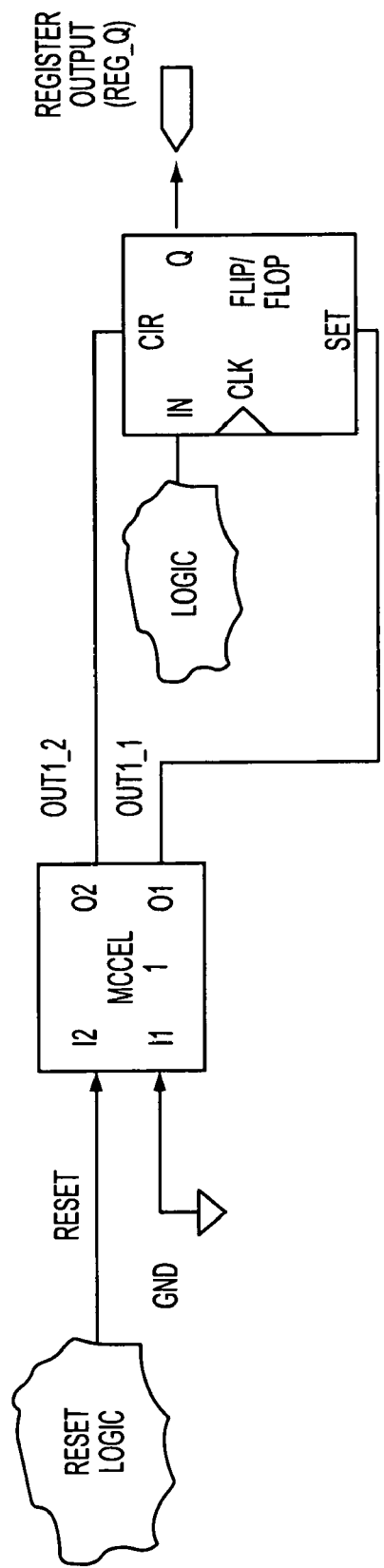

FIG. 37A illustrates a dual-line MCCEL for control of default register values according to the present invention. MCCELs can perform unique logic functions such as the programmable flip-flop clear/set control logic shown in this figure. In this embodiment, a dual-line MCCEL is used to multiplex the appropriate active high 'RESET' signal to either the 'CLR' or 'SET' active high pins of the flip-flop. Based on the state of the MCCEL, the flip-flop can either be cleared or set when the reset is active. If 'RESET' is low, the outputs of MCCEL1 will always be low. Both 'CLR' and 'SET' pins of the flip-flop will be low. The output 'Reg_Q' of the flip-flop will follow its input 'In' on the rising edge of the clock signal 'CLK'. If 'RESET' is high and MCCEL1 is in its default state of '0' (uncrossed), then 'Out1_1' will be low and Out1_2 will be high. The 'CLR' pin will be high and the 'SET' pin will low. The flip-flop output is cleared as shown in the accompanying logic table of FIG. 37B. If 'RESET' is high and MCCEL1 is in state '1' (crossed), then 'Out1_1' will be high and Out1_2 will be low. The 'CLR' pin will be low and the 'SET' pin will high. The flip-flop output is set as shown in the logic table. If the 'RESET' signal is active low, then both 'CLR' and 'SET' signals should also be active low and the 'GND' inputs to I1 of MCCEL1 should be tied to 'VDD' instead. The MCCEL logic as shown in FIG. 37A performs its function without the need for any inverters or other logic gates. It is an all-metal layer only solution that does not require any active silicon.

CONCLUSION

Consequently, embodiments of the present invention provide at least the following advantages as compared to conventional methodologies: reduces additional metal mask costs due to revision ID, default register changes or connectivity between adjacent blocks of logic; reduces additional labor costs due to implementation of above features; the metal layer only implementation reduces the costs and complexity of implementation; single metal layer or via layer changes can be made at any metal layer; provides unlimited modification capability; a small footprint size saves area on the chip; excellent reliability due to metal only implementation; dual output per cell, logic 1 and logic 0, eliminates need for inverters and buffers; fits in standard cell format which simplifies layout; can be physically FIB etched to change defaults after chip has been manufactured; can be placed anywhere on the chip to reduce routing congestion; can be implemented in existing or new chip designs; does not introduce Design Rule Check (DRC) and Layout vs. Schematic Check (LVS) errors in layout such as floating metal after changing a metal or a via layer; requires power and ground only on M1, which improves route ability and reduces blockage; and can be used to customize unique customer specific requirements by re-programming default registers.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

We claim:

1. In an integrated circuit chip including a plurality of metal layers, first and second supply potentials and at least two adjacent logic blocks, a modifiable circuit for coupling the at least two adjacent logic blocks, comprising:
   a plurality of modifiable cycles formed between the at least two adjacent logic blocks, each modifiable cycle having
   a first metal interconnect structure that traverses the plurality of metal layers using a first plurality of vias, wherein said first metal interconnect structure is located at a boundary of the at least two adjacent logic blocks, and
   a second metal interconnect structure that traverses the plurality of metal layers using a second plurality of vias, wherein said second metal interconnect structure is located at said boundary of the at least two adjacent logic blocks;
   wherein said first metal interconnect structure and said second metal interconnect structure are coupled together; and
   wherein a state of any modifiable cycle is repeatedly programmable by altering any one of the metal layers and/or any one of the vias.

2. The circuit of claim 1, wherein prior to programming, at least one pair of said first and second metal interconnect structures is coupled at a top metal layer.

3. The circuit of claim 1, wherein at least one modifiable cycle is laid out to form a ladder structure that traverses the plurality of metal layers from a bottom metal layer to a top metal layer and back to the bottom metal layer.

4. The circuit of claim 3, wherein said ladder structure is arranged to form a cube-shaped structure.

5. The circuit of claim 4, wherein the first and second supply potentials comprise two buses located in a central region of said cube-shaped structure and are accessible at each of the metal layers.

6. The circuit of claim 3, wherein said ladder structure is arranged to form a spiral-shaped structure.

7. The circuit of claim 6, wherein the first and second supply potentials comprise buses accessible at each of the metal layers.

8. The circuit of claim 1, wherein at least one pair of said first and second metal interconnect structures is not electrically coupled to each other at a top metal layer thereby forming two interconnects between the at least two adjacent logic blocks.

9. The circuit of claim 1, wherein one of said first or second metal interconnect structures of a modifiable cycle is coupled to the first supply potential at a bottom metal layer and the other of said first and second metal interconnect structures of a modifiable cycle is coupled to the second supply potential at the bottom metal layer.

10. The circuit of claim 8, wherein at least one pair of said first and second metal interconnect structures arranged to form a ladder structure.

11. The circuit of claim 8, wherein at least one pair of said first and second metal interconnect structures is arranged to form an offset ladder structure.

12. The circuit of claim 8, wherein at least one pair of said first and second metal interconnect structures is arranged to form a stacked structure.

13. The circuit of claim 12, wherein said stacked structure comprises first and second alternating metal interconnect patterns.

14. The circuit of claim 13, wherein:
   said first alternating metal interconnect pattern comprises first and second interspersed metal traces, and
   said second alternating metal interconnect pattern comprises third and fourth interspersed metal traces, and
   wherein said third and fourth interspersed metal traces form a mirror image of first and second interspersed metal traces.

15. The circuit of claim 14, wherein said first plurality of vias interconnect ones of said first and third interspersed metal traces and said second plurality of vias interconnect ones of said second and fourth interspersed metal traces.

16. The circuit of claim 14, wherein the circuit is programmed at any metal layer by forming an open circuit in each of said first and second interspersed metal traces of that layer thereby splitting each metal trace into two portions, and coupling together a first portion of said first interspersed metal trace to a first portion of said second interspersed metal trace and coupling together a second portion of said first interspersed metal trace to a second portion of said second interspersed metal trace.

17. The circuit of claim 16, wherein said open circuits and coupling is not performed in regions where vias are located.

18. The circuit of claim 17, wherein said programming is reversible during a subsequent chip revision.

19. The circuit of claim 15, wherein the circuit is programmed at any of a plurality of via layers by removing two vias and inserting two vias for a modifiable cycle.

20. The circuit of claim 19, wherein said programming is reversible during a subsequent chip revision.

21. The circuit as in one of claims 17–19, wherein one of said first and second metal interconnect structures is coupled to the first supply potential at a bottom metal layer and the other of said first and second metal interconnect structures is coupled to the second supply potential at the bottom metal layer.

22. The circuit of claim 8, wherein said first and second metal interconnect structures are arranged to form a dual ladder structure.

23. The circuit of claim 8, wherein said first and second metal interconnect structures are arranged to form a staircase structure.

24. The circuit of claim 1, wherein said first metal interconnect structure is coupled to one of said first and second supply potentials and said second metal interconnect structure is coupled to the other one of said first and second supply potentials.

25. In an integrated circuit chip including a plurality of metal layers, first arid second supply potentials and at least two adjacent logic blocks, a modifiable circuit for coupling the at least two adjacent logic blocks, comprising:
   a plurality of modifiable cycles formed between the at least two adjacent logic blocks, each cycle having
   a first metal interconnect structure that traverses the plurality of metal layers using a first plurality of vias, wherein said first metal interconnect structure is located at a boundary of the at least two adjacent logic blocks,
   a second metal interconnect structure that traverses the plurality of metal layers using a second plurality of vias, wherein said second metal interconnect structure is located at said boundary of the at least two adjacent logic blocks;
   wherein a state of any modifiable cycle is repeatedly programmable by altering any one of the metal layers and/or any one of the vias and
   wherein prior to programming, said first and second metal interconnect structures are coupled at a top metal layer.

26. The circuit of claim 25, wherein one of said first and second metal interconnect structures is coupled to the first supply potential at a bottom metal layer and the other of said first and second metal interconnect structures is coupled to the second supply potential at the bottom metal layer.

27. In an integrated circuit chip including a plurality of metal layers, first and second supply potentials and at least two adjacent logic blocks, a modifiable circuit for coupling the at least two adjacent logic blocks, comprising:
   a plurality of modifiable cycles coupled together, each cycle having
   a first metal interconnect structure that traverses the plurality of metal layers using a first plurality of vias, wherein said first metal interconnect structure is located at a boundary of the at least two adjacent logic blocks,
   a second metal interconnect structure that traverses the plurality of metal layers using a second plurality of vias, wherein said second metal interconnect structure is located at said boundary of the at least two adjacent logic blocks;
   wherein a state of said any modifiable cycle is repeatedly programmable by altering any one of the metal layers and/or any one of the vias; and
   wherein said first and second metal interconnect structures are not electrically coupled to each other at a top metal layer thereby forming two interconnects between the at least two adjacent logic blocks.

28. The circuit of claim 27, wherein one of said first and second metal interconnect structures is coupled to the first supply potential at a bottom metal layer and the other of said first and second metal interconnect structures is coupled to the second supply potential at the bottom metal layer.

* * * * *